(12) United States Patent
McMahon et al.

(10) Patent No.: US 9,728,952 B2
(45) Date of Patent: Aug. 8, 2017

(54) ELECTRICAL WIRING DEVICE WITH PROTECTIVE FEATURES

(71) Applicant: Pass & Seymour, Inc., Syracuse, NY (US)

(72) Inventors: Michael F. McMahon, East Syracuse, NY (US); Kent R. Morgan, Groton, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 290 days.

(21) Appl. No.: 14/512,769

(22) Filed: Oct. 13, 2014

(65) Prior Publication Data

US 2015/0043109 A1    Feb. 12, 2015

Related U.S. Application Data

(63) Continuation of application No. 12/972,106, filed on Dec. 17, 2010, now Pat. No. 8,861,146.

(51) Int. Cl.

| H02H 3/16 | (2006.01) |
|---|---|
| H01H 47/22 | (2006.01) |
| G01R 31/02 | (2006.01) |
| H02H 3/33 | (2006.01) |

(52) U.S. Cl.
CPC .......... *H02H 3/162* (2013.01); *G01R 31/025* (2013.01); *H01H 47/22* (2013.01); *H02H 3/335* (2013.01)

(58) Field of Classification Search
CPC ........ H02H 3/162; H02H 3/335; H01H 47/22; G01R 31/025
See application file for complete search history.

(56) References Cited

U.S. PATENT DOCUMENTS

| 3,872,354 A | 3/1975 | Nestor |
| 3,953,766 A | 4/1976 | Howell et al. |
| 4,309,681 A | 1/1982 | Draper |
| 4,345,289 A | 8/1982 | Howell |
| 4,359,626 A | 11/1982 | Potter |

(Continued)

FOREIGN PATENT DOCUMENTS

| WO | 2007027908 A3 | 3/2007 |
| WO | 2007056668 | 5/2007 |

(Continued)

*Primary Examiner* — Zeev V Kitov
(74) *Attorney, Agent, or Firm* — Bond Schoeneck & King, PLLC; George McGuire; Frederick Price

(57) ABSTRACT

The present invention is directed to an electrical wiring device that includes an automatic test circuit configured to commence an automatic test at a predetermined time such that a test current propagates on a test conductor. The sensor assembly provides a sensor test output responsive to the test current only if both the differential transformer and the grounded neutral transformer are operative. A fault detector circuit is configured to generate a test detection signal in response to the sensor test output only if the fault detector circuit is operable and the at least one power supply is substantially charged. A device integrity evaluation circuit includes a timer that effects a tripped state when a time measurement exceeds a threshold, the test detection signal resetting the time measurement when properly wired before the time measurement exceeds the predetermined threshold but does not reset the time measurement when miswired.

26 Claims, 11 Drawing Sheets

(56) References Cited

U.S. PATENT DOCUMENTS

| | | |
|---|---|---|
| 4,412,193 A | 10/1983 | Bienwald et al. |
| 4,477,857 A | 10/1984 | Crocker |
| 4,574,324 A | 3/1986 | Packard |
| 4,598,331 A | 7/1986 | Legatti |
| 4,618,907 A | 10/1986 | Leopold |
| 4,931,761 A | 6/1990 | Kijima |
| 4,979,070 A | 12/1990 | Bodkin |
| 5,177,657 A | 1/1993 | Baer |
| 5,202,662 A | 4/1993 | Bienwald |
| 5,363,083 A | 11/1994 | Fischer |
| 5,363,269 A | 11/1994 | McDonald |
| 5,418,678 A | 5/1995 | McDonald |
| 5,477,412 A | 12/1995 | Neiger |
| 5,541,800 A | 7/1996 | Misencik |
| 5,594,398 A | 1/1997 | Marcou |
| 5,600,524 A | 2/1997 | Neiger et al. |
| 5,638,243 A | 6/1997 | Torezan |
| 5,661,623 A | 8/1997 | McDonald |
| 5,706,155 A | 1/1998 | Neiger |
| 5,715,125 A | 2/1998 | Neiger et al. |
| 5,729,417 A * | 3/1998 | Neiger ............... H02H 3/338 361/45 |
| 5,923,239 A | 7/1999 | Krueger |
| 5,963,408 A | 10/1999 | Neiger et al. |
| 6,040,967 A | 3/2000 | DiSalvo |
| 6,043,966 A | 3/2000 | Krueger |
| 6,052,265 A | 4/2000 | Zaretsky |
| 6,111,733 A | 8/2000 | Neiger et al. |
| 6,226,161 B1 | 5/2001 | Neiger et al. |
| 6,246,558 B1 | 6/2001 | DiSalvo |
| 6,262,871 B1 | 7/2001 | Nemir |
| 6,317,307 B1 | 11/2001 | Bone |
| 6,370,001 B1 | 4/2002 | Macbeth |
| 6,381,112 B1 | 4/2002 | DiSalvo et al. |
| 6,407,893 B1 | 6/2002 | Neiger |
| 6,433,977 B1 | 8/2002 | Macbeth |
| 6,437,953 B2 | 8/2002 | DiSalvo |
| 6,442,007 B1 | 8/2002 | Li |
| 6,492,894 B2 | 12/2002 | Bone |
| 6,522,510 B1 | 2/2003 | Finlay |
| 6,587,319 B1 | 7/2003 | Finlay |
| 6,590,753 B1 | 7/2003 | Finlay |
| 6,621,388 B1 | 9/2003 | Macbeth |
| 6,628,486 B1 | 9/2003 | Macbeth |
| 6,670,870 B2 | 12/2003 | Macbeth |
| 6,674,289 B2 | 1/2004 | Macbeth |
| 6,721,156 B2 | 4/2004 | Masghati |
| 6,724,590 B1 | 4/2004 | Radosavljevic |
| 6,734,769 B1 | 5/2004 | Germain |
| 6,788,508 B2 | 9/2004 | Papallo, Jr. |
| 6,807,035 B1 | 10/2004 | Baldwin et al. |
| 6,807,036 B2 | 10/2004 | Baldwin |
| 6,831,819 B2 | 12/2004 | Nemir et al. |
| 6,842,095 B2 | 1/2005 | Macbeth |
| 6,850,394 B2 | 2/2005 | Kim |
| 6,856,498 B1 | 2/2005 | Finlay, Sr. |
| 6,867,954 B2 | 3/2005 | Wu et al. |
| 6,873,158 B2 | 3/2005 | Macbeth |
| 6,900,972 B1 | 5/2005 | Chan |
| 6,937,452 B2 | 8/2005 | Chan |
| 6,952,150 B2 | 10/2005 | Radosavljevic et al. |
| 6,958,895 B1 | 10/2005 | Radosavljevic et al. |
| 6,980,005 B2 | 12/2005 | Finlay, Sr. et al. |
| 7,009,473 B2 | 3/2006 | Zhang |
| 7,068,481 B2 | 6/2006 | Radosavljevic et al. |
| 7,082,021 B2 | 7/2006 | Chan et al. |
| 7,084,725 B2 | 8/2006 | Richter |
| 7,088,205 B2 | 8/2006 | Germain |
| 7,088,206 B2 | 8/2006 | Germain |
| 7,098,761 B2 | 8/2006 | Germain |
| 7,099,129 B2 | 8/2006 | Neiger |
| 7,116,191 B2 | 10/2006 | Wang |
| 7,133,266 B1 | 11/2006 | Finlay, Sr. |
| 7,149,065 B2 | 12/2006 | Baldwin |
| 7,154,715 B2 | 12/2006 | Yamanaka et al. |
| 7,154,718 B1 | 12/2006 | Finlay, Sr. |
| 7,161,780 B2 | 1/2007 | Germain |
| 7,164,563 B2 | 1/2007 | Chan |
| 7,164,564 B1 | 1/2007 | Finlay, Sr. et al. |
| 7,167,066 B2 | 1/2007 | Wang |
| 7,173,799 B1 | 2/2007 | Weeks et al. |
| 7,184,250 B2 | 2/2007 | Bonilla |
| 7,187,526 B2 | 3/2007 | DiSalvo |
| 7,195,500 B2 | 3/2007 | Huang |
| 7,196,886 B2 | 3/2007 | Chan |
| 7,209,330 B2 | 4/2007 | DiSalvo |
| 7,212,386 B1 | 5/2007 | Finlay, Sr. |
| 7,227,435 B2 | 6/2007 | Germain |
| 7,239,491 B1 | 7/2007 | Morgan |
| 7,253,629 B1 | 8/2007 | Richards et al. |
| 7,256,973 B1 | 8/2007 | Radosavljevic |
| 7,265,956 B2 | 9/2007 | Huang |
| 7,268,559 B1 | 9/2007 | Chen et al. |
| 7,283,340 B1 | 10/2007 | Finlay, Sr. |
| 7,289,306 B2 | 10/2007 | Huang |
| 7,292,419 B1 | 11/2007 | Nemir |
| 7,295,410 B1 | 11/2007 | Packard |
| 7,295,415 B2 | 11/2007 | Huang |
| 7,298,598 B1 | 11/2007 | Morgan |
| 7,307,821 B2 | 12/2007 | Wang |
| 7,312,963 B1 | 12/2007 | Radosavljevic |
| 7,315,227 B2 | 1/2008 | Huang |
| 7,315,437 B2 | 1/2008 | Bonilla et al. |
| 7,317,600 B2 | 1/2008 | Huang |
| 7,336,457 B2 | 2/2008 | Liscinsky |
| 7,336,458 B2 | 2/2008 | Ziegler |
| 7,355,497 B2 | 4/2008 | Germain |
| 7,355,827 B2 | 4/2008 | Wang |
| 7,365,621 B2 | 4/2008 | Germain |
| 7,372,678 B2 | 5/2008 | DiSalvo et al. |
| 7,375,938 B1 | 5/2008 | Radosavljevic |
| 7,400,477 B2 | 7/2008 | Campolo |
| 7,400,479 B2 | 7/2008 | DiSalvo |
| 7,403,086 B2 | 7/2008 | Wu |
| 7,408,432 B2 | 8/2008 | Shi |
| 7,411,766 B1 | 8/2008 | Huang |
| 7,414,499 B2 | 8/2008 | Germain |
| 7,414,818 B2 | 8/2008 | Shi |
| 7,439,832 B1 | 10/2008 | Radosavljevic et al. |
| 7,439,833 B2 | 10/2008 | Germain |
| 7,443,309 B2 | 10/2008 | Baldwin et al. |
| 7,463,124 B2 | 12/2008 | DiSalvo |
| 7,492,558 B2 | 2/2009 | Germain |
| 7,492,559 B2 | 2/2009 | Zhang |
| 7,498,909 B2 | 3/2009 | Zhang |
| 7,498,910 B2 | 3/2009 | Gallas |
| 7,515,024 B2 | 4/2009 | Chen |
| 7,518,840 B2 | 4/2009 | Elms |
| 7,522,064 B2 | 4/2009 | Zhang et al. |
| 7,525,402 B2 | 4/2009 | Gao |
| 7,525,441 B2 | 4/2009 | Zhang |
| 7,535,371 B2 | 5/2009 | Wang |
| 7,538,647 B2 | 5/2009 | Leopold |
| 7,538,993 B2 | 5/2009 | Huang |
| 7,538,994 B2 | 5/2009 | Bonilla |
| 7,542,252 B2 | 6/2009 | Chan |
| 7,545,244 B2 | 6/2009 | DiSalvo |
| 7,573,692 B1 | 8/2009 | Weeks et al. |
| 7,576,959 B2 | 8/2009 | Huang et al. |
| 7,576,960 B2 | 8/2009 | Gao et al. |
| 7,586,718 B1 | 9/2009 | Radosavljevic et al. |
| 7,592,924 B2 | 9/2009 | Zhang et al. |
| 7,598,828 B1 | 10/2009 | Weeks et al. |
| 7,626,788 B2 | 12/2009 | Wang et al. |
| 7,642,457 B2 | 1/2010 | Weeks et al. |
| 7,719,804 B1 | 5/2010 | Morgan et al. |
| 7,733,617 B2 | 6/2010 | Baldwin et al. |
| 7,751,162 B1 | 7/2010 | Packard et al. |
| 7,791,848 B2 | 9/2010 | Baldwin et al. |
| 7,791,850 B2 | 9/2010 | Chen |
| 7,800,873 B2 | 9/2010 | Batko et al. |
| 7,800,874 B2 | 9/2010 | DiSalvo et al. |
| 7,852,606 B2 | 12/2010 | Mernyk et al. |
| 7,859,368 B2 | 12/2010 | Huang et al. |

(56) References Cited

U.S. PATENT DOCUMENTS

| | | |
|---|---|---|
| 7,911,746 B2 | 3/2011 | Zaretsky et al. |
| 8,054,590 B2 | 11/2011 | Li et al. |
| 8,081,001 B2 | 12/2011 | Hooper et al. |
| 2004/0223272 A1 | 11/2004 | Germain |
| 2005/0063109 A1 | 3/2005 | Baldwin |
| 2006/0139132 A1 | 6/2006 | Porter |
| 2006/0181373 A1 | 8/2006 | Germain |
| 2006/0268472 A1 | 11/2006 | Winch |
| 2006/0279886 A1 | 12/2006 | Huang |
| 2006/0285262 A1 | 12/2006 | Neiger |
| 2007/0014058 A1 | 1/2007 | Chan |
| 2007/0030608 A1 | 2/2007 | Baldwin |
| 2007/0035898 A1 | 2/2007 | Baldwin |
| 2007/0053118 A1 | 3/2007 | Germain |
| 2007/0133136 A1 | 6/2007 | Germain |
| 2007/0188955 A1 | 8/2007 | Elms |
| 2007/0215576 A1 | 9/2007 | Chung |
| 2007/0230072 A1 | 10/2007 | Zhang |
| 2007/0268635 A1 | 11/2007 | Bonasia |
| 2007/0274012 A1 | 11/2007 | Bonasia |
| 2008/0007879 A1 | 1/2008 | Zaretsky |
| 2008/0013227 A1 | 1/2008 | Mernyk et al. |
| 2008/0022153 A1 | 1/2008 | Wang |
| 2008/0024252 A1 | 1/2008 | Gallas |
| 2008/0024945 A1 | 1/2008 | Gao |
| 2008/0088992 A1 | 4/2008 | Williamson |
| 2008/0094765 A1 | 4/2008 | Huang |
| 2008/0112099 A1 | 5/2008 | Li |
| 2008/0123227 A1 | 5/2008 | Bonasia |
| 2008/0170341 A1 | 7/2008 | Huang |
| 2008/0186642 A1 | 8/2008 | Campolo |
| 2008/0225448 A1 | 9/2008 | Li |
| 2008/0272925 A1 | 11/2008 | Griffin |
| 2009/0040667 A1 | 2/2009 | DiSalvo et al. |
| 2009/0052098 A1 | 2/2009 | DiSalvo |
| 2009/0086389 A1 | 4/2009 | Huang |
| 2009/0086390 A1 | 4/2009 | Huang |
| 2009/0091869 A1 | 4/2009 | Huang |
| 2009/0128264 A1 | 5/2009 | DiSalvo |
| 2009/0147416 A1 | 6/2009 | Zheng |
| 2009/0147418 A1 | 6/2009 | Li et al. |
| 2009/0161271 A1 | 6/2009 | Huang et al. |
| 2009/0180222 A1 | 7/2009 | Chen et al. |
| 2009/0251148 A1 | 10/2009 | Finlay, Sr. et al. |
| 2009/0262472 A1 | 10/2009 | Weeks et al. |
| 2010/0013491 A1 | 1/2010 | Hooper et al. |
| 2010/0053826 A1 | 3/2010 | Finlay, Sr. et al. |
| 2010/0073178 A1 | 3/2010 | Huang et al. |
| 2010/0134306 A1 | 6/2010 | Zeng et al. |
| 2010/0238597 A1 | 9/2010 | Baldwin et al. |
| 2010/0295568 A1 | 11/2010 | Ostrovsky et al. |

FOREIGN PATENT DOCUMENTS

| | | |
|---|---|---|
| WO | 2007093885 | 8/2007 |
| WO | 2007137180 | 11/2007 |
| WO | 2007143576 | 12/2007 |
| WO | 2008005928 | 10/2008 |

* cited by examiner

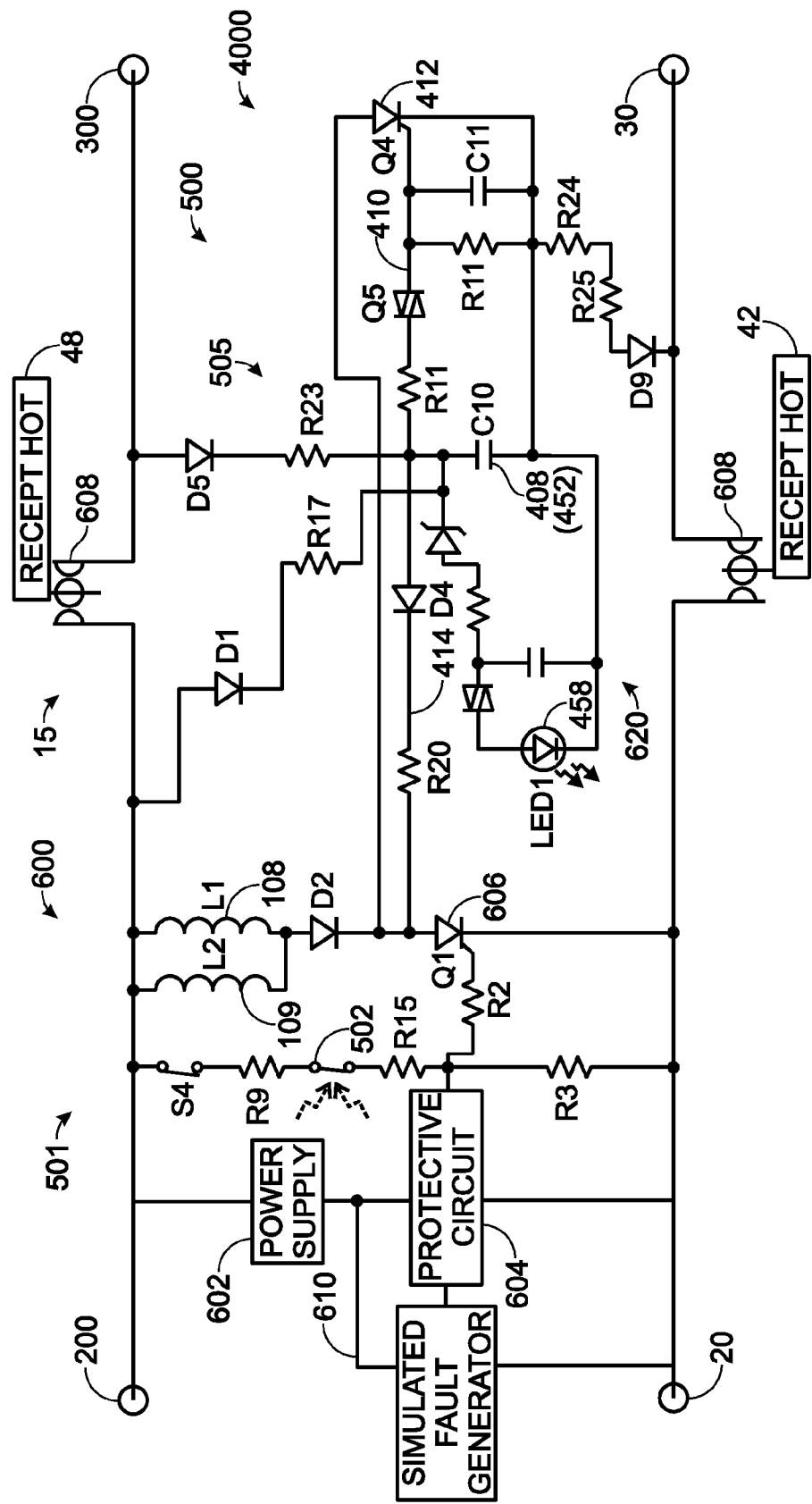
Fig. 4  PROTECTIVE CIRCUIT WATCHDOG MISWIRE

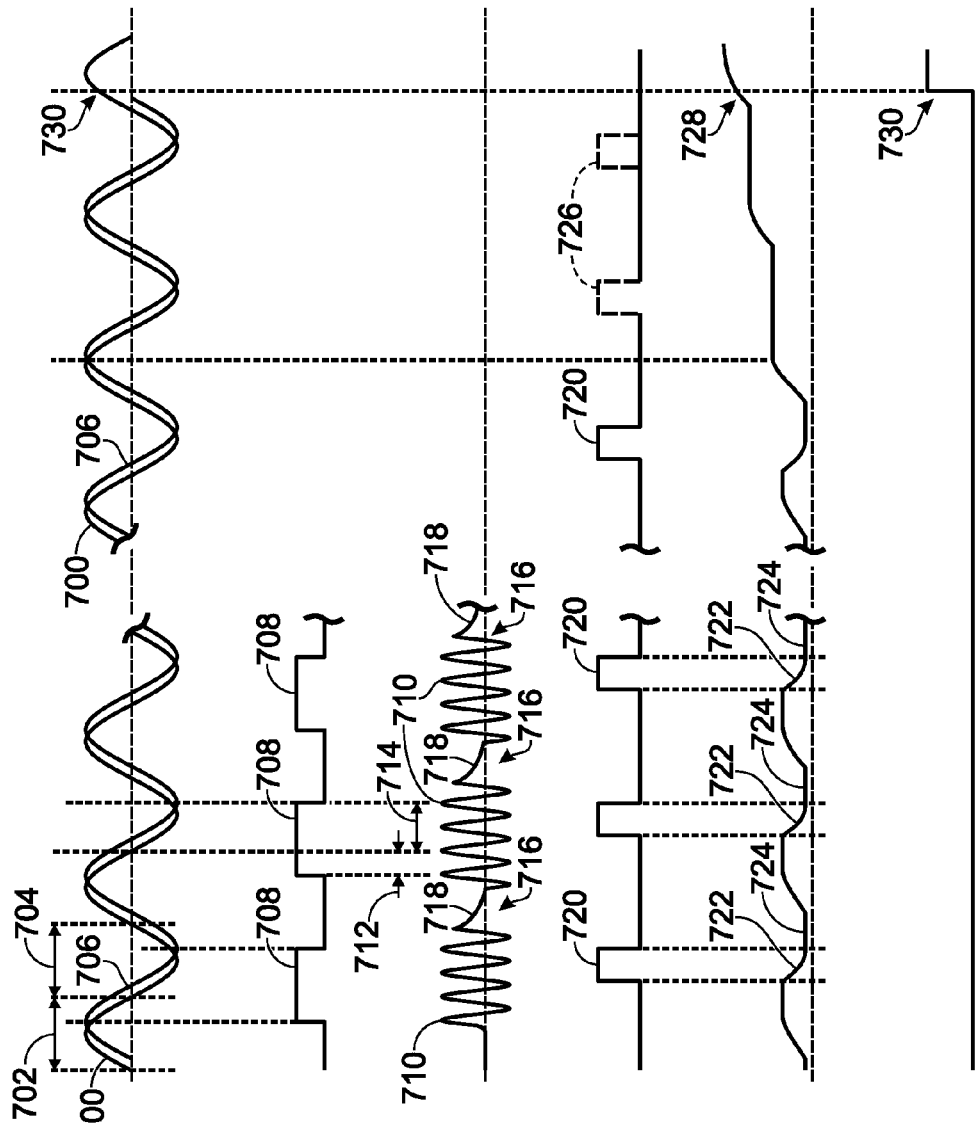

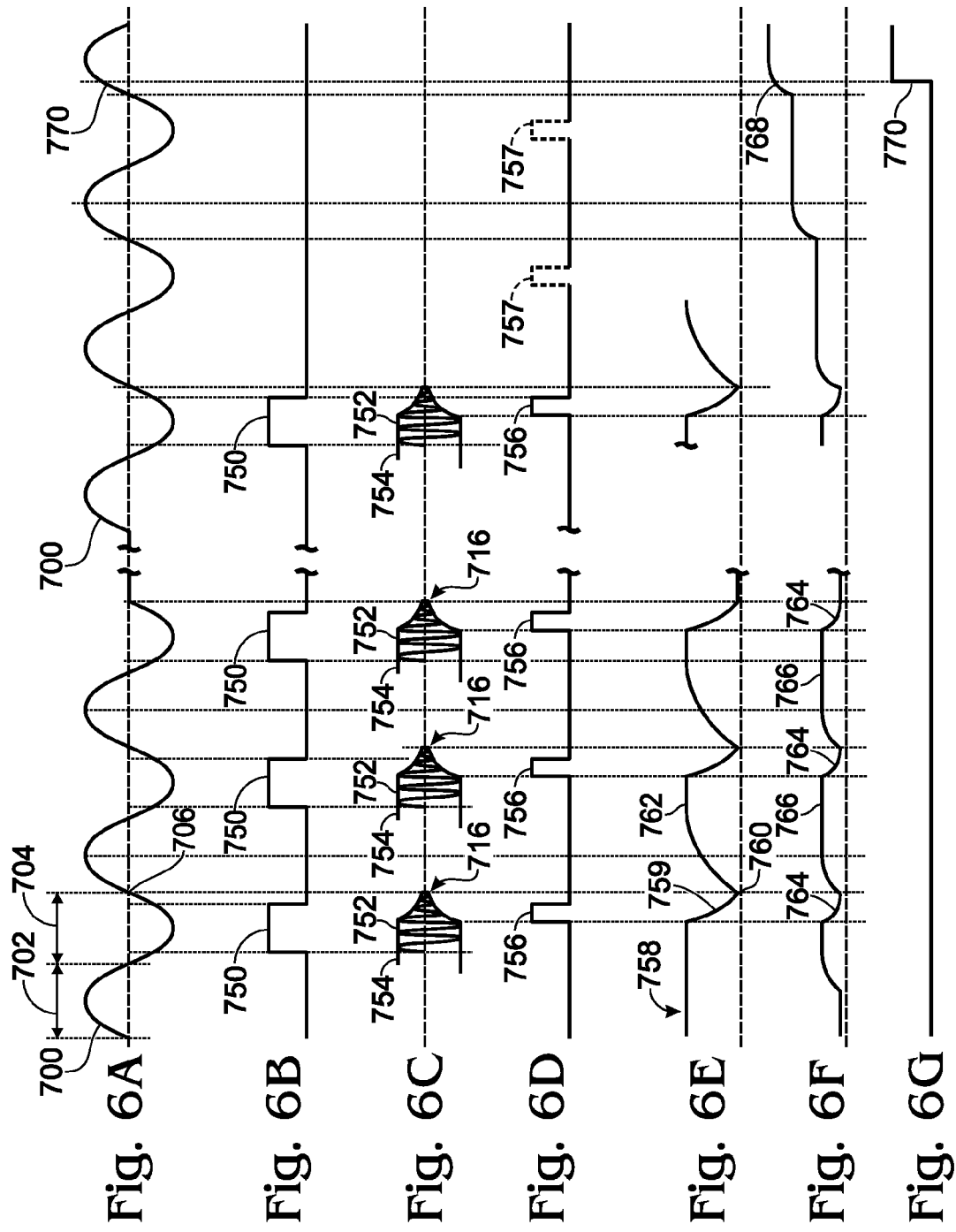

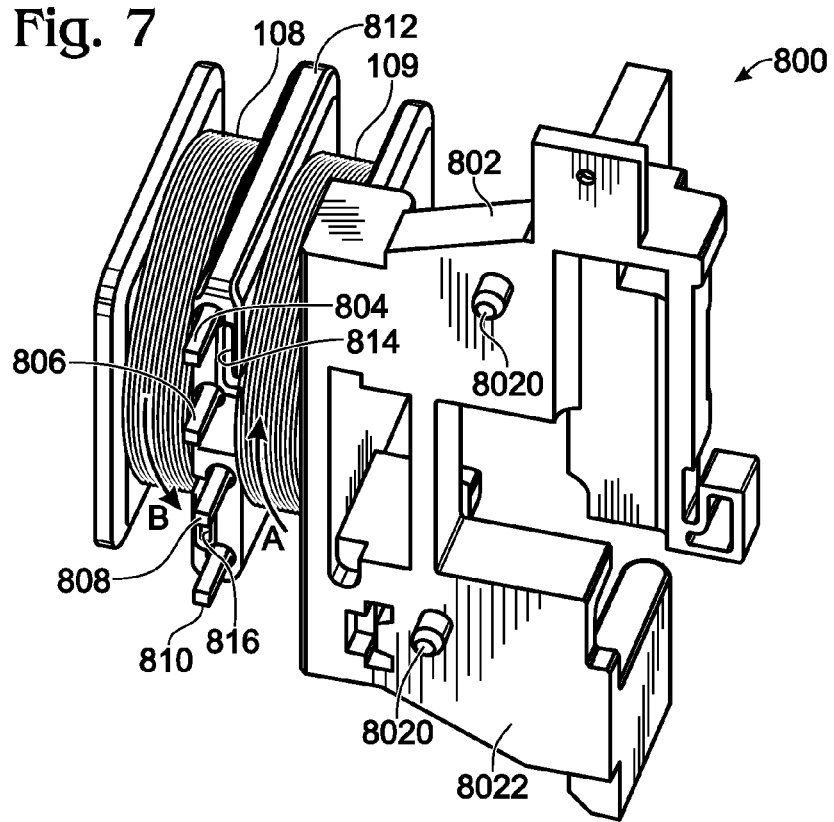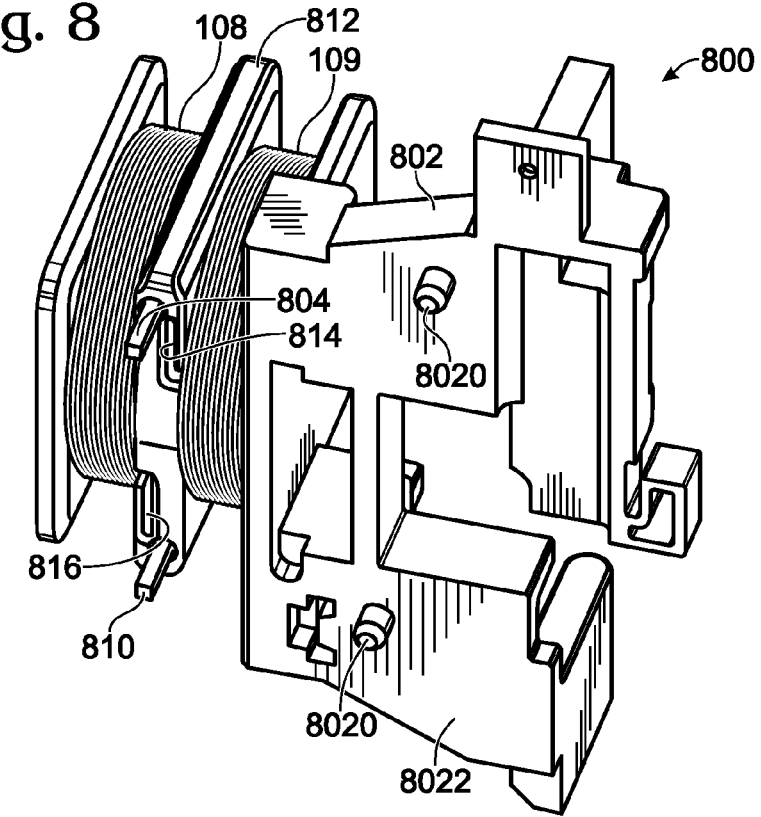

ELECTRICAL WIRING DEVICE WITH PROTECTIVE FEATURES

CROSS-REFERENCE TO RELATED APPLICATIONS

This is a continuation of U.S. patent application Ser. No. 12/972,106 filed on Dec. 17, 2010, the content of which is relied upon and incorporated herein by reference in its entirety, and the benefit of priority under 35 U.S.C. §120 is hereby claimed.

BACKGROUND OF THE INVENTION

1. Field of the Invention

The present invention relates generally to electrical wiring devices, and particularly to electrical wiring devices having protective features.

2. Technical Background

An electric distribution system transmits AC power from a breaker box to one or more load circuits disposed in a structure to provide electrical power throughout. A load circuit may include any number of electrical devices such as electrical outlets, lighting devices, appliances, or other such devices. An electric circuit typically includes at least one protection device. Examples of electric circuit protection devices include ground fault circuit interrupters (GFCIs), arc fault circuit interrupters (AFCIs), or devices that include both GFCIs and AFCIs in one protective device.

A protective device is mounted in an upstream outlet box within the electric circuit and non-protective devices, such as receptacles, are mounted downstream of the protective device within the electric circuit. Electrical wiring is placed within the structure between the breaker box and the various outlet boxes in the circuit. At the protective device location, a portion of the electrical wiring is fed into the outlet box. The portion of the electrical wiring is cut into two pieces. For example, the upstream portion of the electrical wiring (i.e., the line cable) is connected to the line terminals of the protective device such that the protective device is connected to the AC power source. The downstream portion of the cable (i.e., the load side cable) is connected to the load terminals of the protective device. The remainder of the load side cable extends to the remainder of the electrical devices (e.g., electrical receptacles) in the electric circuit. A connection process is performed at each outlet box until the terminals of the last device are connected to the electrical wiring.

A protective device typically includes one or more integral face receptacles accessible to a user via the front face of the device. Thus, an electrical appliance with a corded plug may be plugged into the receptacle to obtain power. The electrical loads that may be serviced by the protective device include loads connected to the face receptacles, the downstream wiring, downstream receptacles, user attachable loads plugged into the downstream receptacles, and permanently connected loads (e.g., lighting). When everything in the electric circuit is operating properly, the protective device provides power from the AC power source to the loads in the electric circuit.

As its name suggests, a protective device protects the load circuit from one or more fault conditions. One type of fault condition is known as a ground fault condition. A ground fault may occur, for example, by frayed or missing insulation on a hot conductor disposed somewhere in the load circuit. If a human being (or some other conductive element) were to simultaneously contact the hot conductor and a ground path a current would flow to ground through the person. This current is potentially lethal. Fortunately, the protective device (GFCI) is configured to detect and interrupt the resulting current flow through the body before there is serious injury or even electrocution. Another type of fault condition is a parallel arc fault. This type of fault occurs when there is damaged insulation between a hot conductor and an adjacent conductor (that is at a different potential). The damaged insulation allows a sputtering current to flow across the compromised insulation. A series arc fault represents another type of fault condition. A series arc fault occurs because a termination in the load circuit is loose. For example, a wire nominally terminated by the screw terminal of an electrical device (e.g., an outlet receptacle or a switch) may be loose because the screw terminal is not completely tightened; a small gap may be formed between the wire and the screw terminal. As another example, when a wire is accidentally severed, a small gap may be formed at the cut such that adjacent ends of wire are almost touching. In each instance, a sputtering arc fault may bridge the small gap. The fault current is limited by the impedance of the load. Series arc fault conditions can also occur in the line cable or elsewhere upstream of the AFCI. The protective device (AFCI) senses and detects at least one of these types of arcing conditions and interrupts the current flowing through the fault before there an electrical fire is started. There are other types of protective devices other than the ones described above, such TVSS devices, GFEP devices, etc. The aforementioned protective devices are non-limiting examples of such devices.

One drawback to all prior art electrical devices is that they are subject to one or more end of life conditions. An end-of-life condition refers to a failure that should render the device unusable or unsafe for use. For example, some end of life conditions may make a protective device non-protective. This drawback may be addressed by providing an end-of-life monitoring circuit that is configured to detect the end of life condition and interrupt any unprotected power to the load circuit. A device of this type may also include an end-of-life display that provides a signal to the user indicative of the end-of-life state. Upon learning of the condition, the user would be required to replace the device to resume service to the load circuit. An end-of-life indicator of this type may provide either a visual or audible indication that warns the user that the protective device needs to be replaced.

Another drawback to prior art protective devices relates to the fact that can be miswired during installation. Since the protective device has line terminals and load terminals it is possible to make the mistake of connecting the line cable to the load terminals and the load cable to the line terminals; this condition is commonly referred to a miswiring or reverse wiring. When reverse wired, some prior art GFCIs are not capable of protecting the face receptacles. One approach for solving the problem has been to provide product labeling and installation instructions sheets that warn against miswiring. These have lessened the chances for miswiring but unfortunately some installers choose to ignore installation instruction sheets. Another approach to the aforementioned problem is to include a miswire detection circuit configured to detect a miswired condition and automatically prevent the protective device from resetting. As a result, no power is provided to the downstream circuit or the face terminals. The lack of power eventually induces the installer to correct the miswired condition. While this approach may be successful for an initial GFCI installation, it may not be operative for subsequent reinstallations. Protective devices that do include miswire detection for subsequent installations often include relatively expensive solutions to the problem.

What is needed, therefore, is a protective system that inexpensively detects end of life conditions and miswire conditions in first and subsequent installations.

SUMMARY OF THE INVENTION

The present invention addresses the needs described above by providing a protective system that inexpensively detects both end of life conditions and miswire conditions in first and subsequent installations.

One aspect of the present invention is an electrical wiring device for use in an electrical distribution system including a plurality of line conductors coupled to a source of AC power and a plurality of load conductors. A housing includes a plurality of line terminals and a plurality of load terminals, the plurality of line terminals being configured to terminate the plurality of line conductors and the plurality of load terminals being configured to terminate the plurality of load conductors. The electrical wiring device is in a properly wired condition when the plurality of line conductors are terminated to the plurality of line terminals and in a miswired condition when the plurality of line conductors are terminated to the plurality of load terminals. An internal line conductor and an internal neutral conductor are disposed in the interior of the housing and coupled between the plurality of line terminals and the plurality of load terminals in a reset state and decoupled in a tripped state. A sensor assembly includes a differential transformer and a grounded neutral transformer, the internal line conductor and the internal neutral conductor being routed through the differential transformer and the grounded neutral transformer. An automatic test circuit includes a test conductor routed through the differential transformer and the grounded neutral transformer, the automatic test circuit being configured to commence an automatic test at a predetermined time such that a test current propagates on the test conductor. The sensor assembly provides a sensor test output responsive to the test current only if both the differential transformer and the grounded neutral transformer are operative. A protective circuit includes a fault detector circuit and a power supply circuit coupled to the plurality of line terminals. The power supply circuit is charged in the reset state or charged in the tripped state and in the properly wired condition. The fault detector circuit is configured to generate a test detection signal in response to the sensor test output only if the fault detector circuit is operable and the at least one power supply is substantially charged. A device integrity evaluation circuit is coupled to the plurality of load terminals. The device integrity evaluation circuit includes a timing circuit configured to provide a time measurement and a tripping stimulus to effect the tripped state when the time measurement exceeds a predetermined threshold. The test detection signal resets the time measurement in the properly wired condition before the time measurement exceeds the predetermined threshold but does not reset the time measurement in the miswired condition.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIG. 4 is a diagrammatic depiction of a circuit for protective electrical devices in accordance with another alternate embodiment of the present invention;

FIGS. 5A-5F include a set of timing diagrams for a watchdog circuit in accordance with the embodiment depicted in FIG. 1;

FIGS. 6A-6G include a set of timing diagrams for a watchdog circuit in accordance with the embodiments depicted in FIGS. 2-3;

FIG. 7 is a perspective view of a dual solenoid in accordance with embodiments of the present invention;

FIG. 8 is a perspective view of a dual solenoid in accordance with alternate embodiments of the present invention;

DETAILED DESCRIPTION

Figure 1:
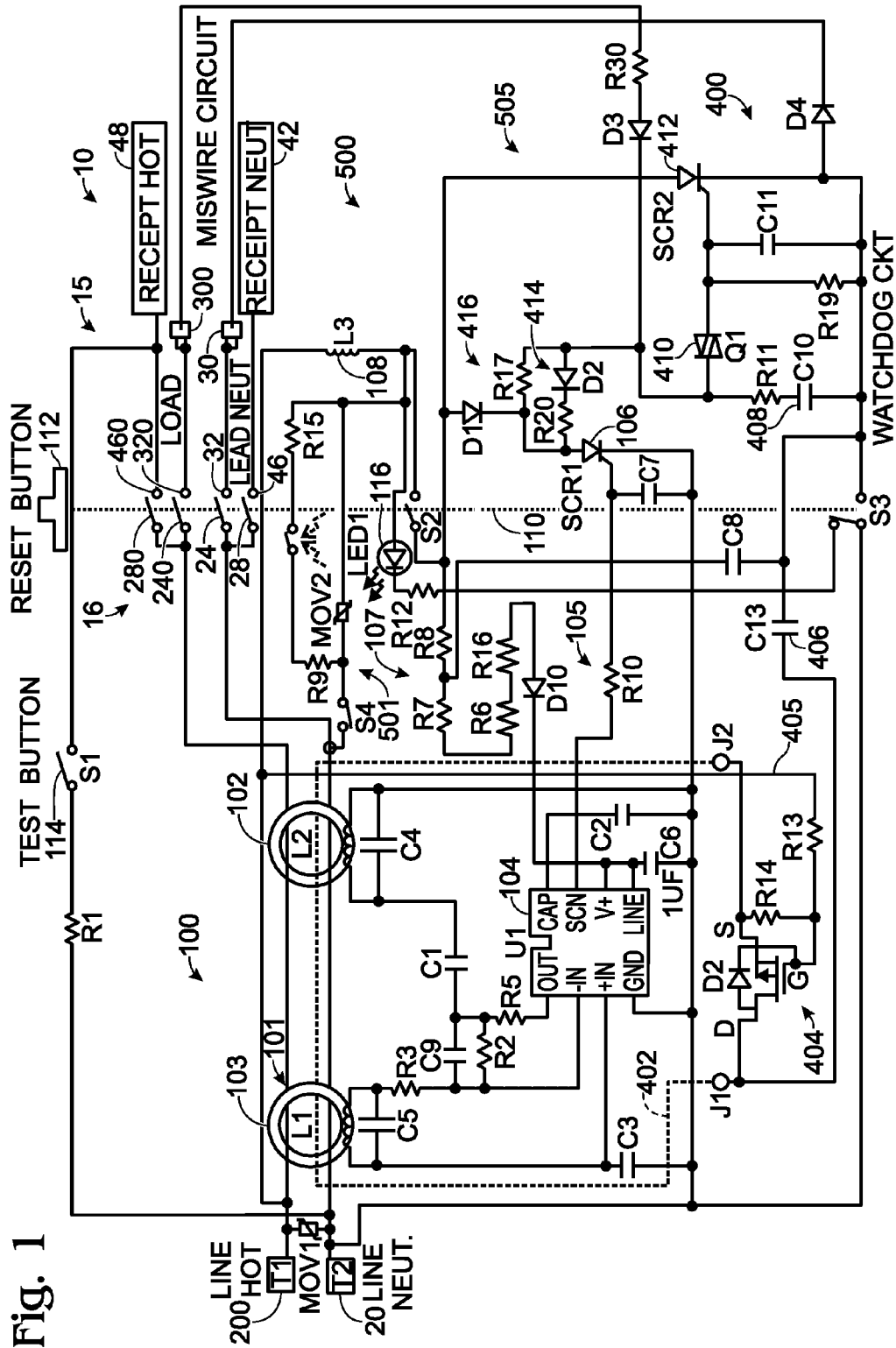
FIG. 1 is a schematic diagram of a protective electrical device in accordance with a first embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protective device of the present invention is shown in FIG. 1, and is designated generally throughout by reference numeral 10.

As embodied herein and depicted in FIG. 1, a schematic diagram of a protective electrical device in accordance with a first embodiment of the present invention is disclosed. As an initial point, while FIG. 1 shows a GFCI embodiment, the teachings of the present invention are also applicable to AFCIs or other protective devices.

The protective electrical wiring device 10 includes a hot line terminal 200, neutral line terminal 20, hot load terminal 300, neutral load terminal 30, hot receptacle terminal 48 and neutral receptacle 42. The protective device 10 is properly wired when the upstream line cable is connected to line terminals (20,200) and the downstream load cable is connected to load terminals (30,300). The receptacles (48, 42), of course, provide power via the face receptacle openings of the wiring device to the user when a corded plug is inserted therein. Again, when the device 10 is properly wired, AC power is directed from the line terminals to the receptacle terminals (42, 48) and the load terminals (30, 300).

The wiring device 10 depicted in FIG. 1 includes a GFCI circuit 100 that includes differential transformer 101 and grounded neutral transformer 102 coupled to detector 104. The line hot conductor and the line neutral conductor are routed through the differential transformer 101 and grounded neutral transformer 102. When a ground fault condition occurs, the current flowing through the line hot conductor and the current flowing through the line neutral conductor are not equal because a portion of the current in the line hot conductor is diverted to ground instead of returning to the power source via the neutral conductor. As its name implies, differential transformer 101 provides a differential current signal to detector 104; the differential current signal represents the difference between the line hot conductor current and the neutral conductor current. If the magnitude of the differential current signal exceeds a predetermined threshold level monitored by the fault detector 104, the detector 104 is configured to turn the SCR 106 ON. The SCR 106 energizes trip solenoid 108 in turn. When the solenoid 108 is energized, the solenoid armature provides an actuation force that trips the circuit interrupter 16 and opening its switch contacts. Note that the fault detector 104 is coupled to silicon controlled rectifier (SCR) 106 by way of a noise filter 105. The noise filter 105 substantially prevents spurious noise signals propagating on the detector 104 output from turning SCR 106 ON.

Circuit interrupter 16 includes line hot switch elements (240, 280) and line neutral switch elements (24, 28). When the device is reset, the line hot switch elements (240, 280) close the hot electrical switch contacts (320, 460) to make the line hot conductor 200 electrically continuous with the load hot terminal 300 and the receptacle load terminal 48. Likewise, the line neutral switch elements (24, 28) close the neutral electrical switch contacts (32, 46) to make the line neutral conductor 20 electrically continuous with the load neutral terminal 30 and the receptacle load neutral terminal 42. As noted above, the solenoid armature provides an actuation force that trips the circuit interrupter 16 such that the line hot switch elements (240, 280) and the movable line neutral switch elements (24, 28) are opened.

The tripping and resetting actions of the circuit interrupter 16 are performed by movement of the latch block 110 (which is depicted in the schematic of FIG. 1 as a dotted line). The line hot switch elements (240, 280) and the line neutral switch elements (24, 28) are coupled to latch mechanism 110. When a user depresses the reset button 112, the latch block is engaged by a reset pin such that the switch elements (24, 28, 240, and 280) are closed (reset). When the solenoid 108 is energized, the solenoid armature applies an actuation force to a latch mechanism causing the reset pin to disengage from the latch block 110; as a result, the switch elements (24, 28, 240, and 280) are opened (tripped).

The switch elements (24, 28, 240 and 280) of circuit interrupter 16 may be implemented using cantilevers, bus bars, solid state switch devices and the like. Reference is made to U.S. Pat. Nos. 6,958,895 and 7,154,718, which are incorporated herein by reference as though fully set forth in its entirety, for a more detailed explanation of various four-pole circuit interrupter arrangements. Reference is made to U.S. Pat. No. 5,594,398, which is incorporated herein by reference as though fully set forth in its entirety, for a more detailed explanation of a bus bar circuit interrupter arrangement.

Device 10 also includes a manual test circuit that includes test button 114 (S1) and test resistor R1. TEST button switch 114 is accessible to the user and introduces a simulated ground fault and provides a convenient method for the user to periodically test the GFCI operation. When the test button 114 is closed by a user's depression thereof, current is diverted from receptacle hot 48 to line neutral 20 to thereby generate a simulated ground fault condition. The simulated fault condition tests the entire GFCI. If the GFCI apparatus passes the test, the latch mechanism 110 will drive the circuit interrupter 16 into the tripped state. The GFCI response to the simulated fault may be deemed a "test acceptance signal." Wire loop 402 (as explained in greater detail below) may be employed to induce a sensor (101, 102) response. Thus, a simulated fault may be generated by either the test signal or the induced fault signal. Hereinafter, both of these signals will be referred to as simulated fault conditions.

Device 10 further includes a trip indicator 116 comprising an LED1 in series with current limiting resistor R12 and switch S3. As shown, switch S3 is a single pole double throw (SPDT) switch. When device 10 is tripped, trip indicator 116 is illuminated because the coupling contacts (in switch S3) connect the indicator 116 to line neutral. When device 10 is reset, there is little or no potential difference across LED1 and R32 because the coupling contacts (in switch S3) disconnect the indicator 116 from line neutral. Those of ordinary skill in the art will recognize that indicator 130 may include an audible annunciator as well as an illumination device.

GFCI circuit 100 includes a grounded neutral transmitter 102 that is configured to detect grounded neutral conditions. As an initial point, the line neutral conductor (i.e., the conductor that is connected to neutral line terminal 20) is deliberately grounded in the electrical circuit. On the other hand, a grounded neutral condition occurs when the load neutral conductor (i.e., the conductor that is connected to load neutral terminal 300) is accidentally grounded. The grounded neutral condition creates a parallel conductive path relative to the neutral return path disposed between neutral line terminal 20 and neutral load terminal 200. Since these two paths are in parallel, they may be thought of as comprising a wire loop. When a grounded neutral condition is not present, grounded neutral transmitter 102 is configured to couple equal signals into the hot and neutral conductors. As noted above, differential transformer 101 senses a current differential; thus, the equal signals provided by grounded neutral transmitter 102 effectively cancel each other. However, when a grounded neutral condition is present, the signal coupled onto the neutral conductor circulates as a current around the parallel conductive path and the return path, forming a conductive loop. Since the circulating current conducts through the neutral conductor but not the hot conductor, a differential current condition is created. Differential transformer 101 senses the differential current between the hot and neutral conductors and the detector 104 generates a fault detection signal in response thereto. The fault detection signal ultimately trips the circuit interrupter 16.

Device 10 also includes an auxiliary switch S2 that is coupled to circuit interrupter 16; the auxiliary switch S2 is open when circuit interrupter 16 is tripped and is closed when circuit interrupter 16 is reset. Auxiliary switch S2 is used to protect the solenoid. Under normal operating conditions one embodiment of the GFCI of the present invention trips out in response to a ground fault within about 25 milliseconds. As a result, solenoid 108 is only momentarily energized. If SCR 106 short circuits due to an end of life condition, solenoid 108 will also be energized indefinitely and ultimately will burn out. The auxiliary switch S2, therefore, is used to protect the solenoid from being burned out if the SCR becomes shorted by an end-of-life condition. Once the SCR 106 fires and energizes the solenoid, the auxiliary switch will open with the tripping of the circuit interrupter 16; the solenoid energizing current ceases when the circuit interrupter trips. Even if the device is reset, switch S2 interrupts the current again and prevents burn-out.

The protective device 10 also includes an end-of-life (EOL) "watchdog" circuit 400. The watchdog circuit 400 periodically determines whether or not GFCI 100 is operational by generating a periodic test signal that is fed-back into the GFCI. In general, if GFCI 100 is in an EOL (end-of-life) state, i.e., incapable of properly responding to the test signal, the watchdog circuit ensures that the device 10 will trip or indicate that the EOL state is extant.

By way of overview, the self-test assembly includes a watchdog circuit 400, a test circuit 401, and a test timing circuit 403. The test circuit 401 includes a wire loop 402 and FET 404. The test timing circuit 403 includes capacitor 406 and resistor 405. The watchdog circuit 400 includes a second SCR 412 that is disposed in parallel with SCR 106; in other words, if an EOL state is extant such that the GFCI circuitry is non-functional, SCR 412 will energize solenoid 108. The control input of SCR 412 is coupled to diac 410 and charging capacitor 408. Essentially, if a self-test is conducted and SCR 106 fails to respond within a predetermined period of time, the charging capacitor 408 will cause diac 410 to turn SCR 412 ON to thereby energize solenoid 108 such that the circuit interrupter 16 is tripped.

The self-test circuit 401 generates a simulated grounded neutral test signal by way of wire loop 402 when FET 404 is turned ON. The ON state resistance of FET 404 is less than about 4 Ohms. The wire loop 402 in combination with the FET (in the ON state) forms a loop that passes through the differential transformer 101 and neutral transmitter 102 to simulate a grounded neutral condition. In an alternate embodiment, instead of having a third wire passing through the transformers (101, 102) the wire loop 402 may incorporate a portion of the neutral conductor that is disposed between line neutral terminal 20 and load neutral terminal 30. One advantage for using the third wire technique, i.e., not incorporating a portion of the neutral conductor in the wire loop, relates to noise immunity. In particular, when the third wire is employed the wire loop 402 and the neutral conductor are isolated; thus, the current propagating in wire loop 402 during the self-test is not affected by voltage drops or electrical noise propagating in the neutral conductor. Under certain circumstances, noise propagating on the neutral conductor could impair the test signal and the GFCI's detection thereof.

In one embodiment of the present invention, the FET 404 is turned ON near the conclusion of the positive half cycle of the AC power source and remains ON through a portion of the negative half cycle. The grounded neutral transformer 102 provides a differential current to the sensor 101 in response to the current propagating in wire loop 402. When operating properly, the fault detector 104 provides a fault detection signal that typically turns SCR 106 ON. However, during the test, current flow through SCR 106 is either limited or completely restricted to prevent nuisance tripping of the circuit interrupter. This is accomplished by performing the testing during the negative half cycle or late in the positive half cycle. If the SCR 106 is turned ON late in the positive half-cycle of the AC line cycle, the amount of current propagating through the SCR is not sufficient to energize the solenoid 108. If the SCR 106 is turned ON during the negative half cycle, it is only ON long enough to discharge positive voltage that happens to be on capacitor 408. In any event, SCR 106 cannot conduct current through solenoid 108 during the negative half cycle; diode D1 is also used to block current through the solenoid during the negative half cycle.

As noted above, the timing circuit 403 includes resistor 405 and capacitor 406. The test timing circuit 403 provides the timing for the test circuit, i.e., it determines when FET 404 is turned ON. Resistor 405 and capacitor 406 are coupled across line terminals 20,200 and establish the voltage at the gate of FET 404. Since they are coupled across line terminals 20, 200, the gate signal approximates the AC power source waveform but is phase shifted by the RC time constant established by resistor 405 and capacitor 406. In one embodiment of the present invention, the time constant is about 1 millisecond. The phase shift is responsible for FET 404 turning on late in the positive half cycle and turning off before the end of the negative half cycle. The test signal is turned OFF early in the negative half cycle to give the flux in the core 103 portion of transformer 101 time to decay to prevent nuisance tripping. If the test signal is not turned OFF at this time the resultant flux generated within the core 103 could linger into the start of the positive half cycle and be misinterpreted as a ground fault condition. The timing circuit waveforms are depicted in FIG. 5.

The watchdog circuit 400 operates as follows. If the GFCI is operating properly, the sensor circuit (101, 102), detector 104 and SCR 106 will respond to the test signal. The fault detector 104 will generate a fault detection signal late in the positive half-cycle or relatively early in the negative half-cycle and the SCR 106 will be turned ON. Moreover, the watchdog circuit 400 is configured such that SCR 106 is discharged via a discharging circuit 414. The SCR 106 remains ON until the voltage on capacitor 408 falls to a predetermined level. During the following positive half cycle, capacitor 408 is recharged by way of charging circuit 416. Thus, the process of testing the GFCI and discharging capacitor 408 repeats every line cycle until the GFCI enters an EOL condition. When that happens, capacitor 408 fails to discharge. Thus, the capacitor 408 voltage reaches the breakover voltage of diac 410 when there is an EOL condition but not when the GFCI is operating properly.

An EOL condition, e.g., may include inter alia, an open-circuited grounded neutral transmitter 102, a faulty detector 104 circuit, a damaged SCR 106, etc. When there is an EOL condition in a GFCI 100 component, the SCR 106 does not turn ON in response to the test signal and capacitor 408 is not discharged. On the other hand, capacitor 408 will continue to receive additional charge from charging circuit 416 every positive half-cycle. After a predetermined number of line cycles have elapsed, charging circuit 416 will cause diac 410 to break over and diac 410 will provide the necessary current to turn SCR 412 ON. SCR 412 energizes solenoid 108 which in turn trips the latch mechanism 110. If the user resets the circuit interrupter, the testing process will be repeated such that the circuit interrupter is tripped again. Thus, once device 10 is in an EOL state, the device may be reset only momentarily. The repeated tripping functions as a means for indicating device 10 failure.

Figure 2:
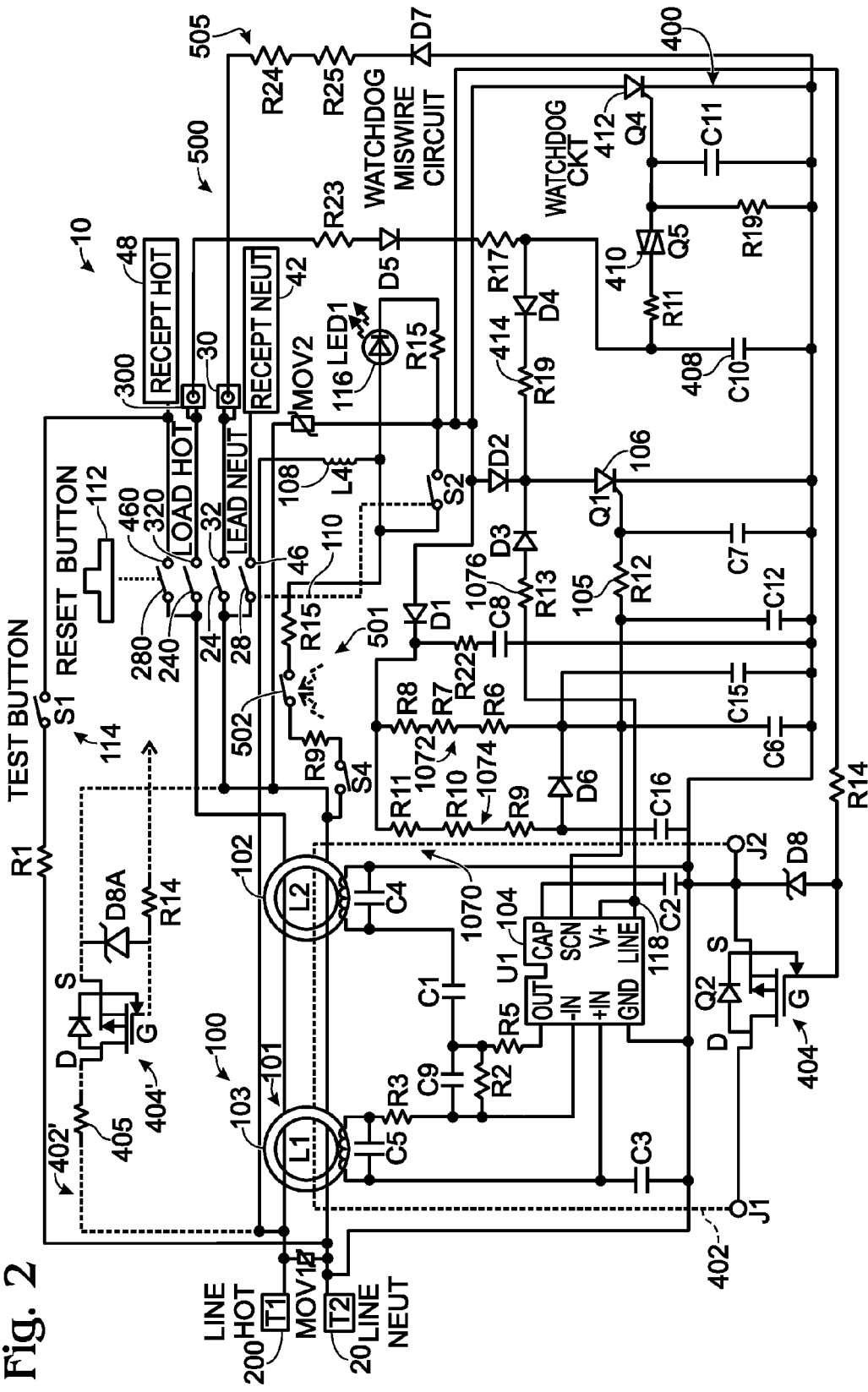
FIG. 2 is a schematic diagram of a protective electrical device in accordance with an alternate embodiment of the present invention.

As embodied herein and depicted in FIG. 2, a schematic diagram of a protective electrical device in accordance with an alternate embodiment of the present invention is disclosed. In this embodiment, an alternate test circuit 401' may replace or supplement the test circuit 401 described above. Test circuit 401' is a ground fault simulation circuit that generates a simulated ground fault test signal instead of a simulated grounded neutral test signal. Test circuit 401' includes FET 404' and conductive path 402'. When FET 404' is turned ON, the ground fault simulation circuit generates a simulated ground fault current through conductive path 402' and portions of the hot and neutral conductors that interconnect line terminals 20, 200 to load terminals 30, 300. Unlike one embodiment of test circuit 401, test circuit 401' is not isolated from the internal hot and neutral conductors because it need not be. Voltage drops and other electrical noise occur in the internal conductors; however they have little or no effect due to the large impedance value presented by resistor 405. In one embodiment of the invention, resistor 405 is about 15 k-Ohms FET 404' is turned on by a signal provided by resistor R14. FET 404' is selectively turned ON and OFF to prevent nuisance tripping. In the embodiment depicted in FIG. 2, FET 404' is turned ON during the negative half-cycle and turned OFF later in the negative half cycle, allowing time for the flux in core 103 to decay before the next zero crossing of the AC line cycle is reached. In accordance with the teachings of the present invention, any number of suitable simulated differential signals may be used by the watchdog circuit 400 to determine the operative status of the protective device. For example, a differential signal may be derived from a power supply terminal to provide a pulsed DC differential signal.

Referring back to FIG. 1, the present invention includes both line side miswire protection and load side miswire protection. As noted previously, the term miswiring or reverse wiring refers to a condition wherein the hot and neutral wires in the line cable (and hence the source of AC power) are improperly connected to the load terminals. The line side miswire circuit 501 is coupled to the ground fault detector and simulates a ground fault condition to prevent reset when miswired. Each time there is an attempt to reset the circuit interrupter, it trips. Once the installer corrects the reverse wiring condition and applies source voltage to the line terminals for a certain amount of time, the line-side miswire circuit becomes permanently disabled and the circuit interrupter can be reset. Of course, it is possible that a protective device, having been properly wired, is then removed from the installation and miswired upon re-installation.

The load side miswire circuit 505 is coupled to the end of life detection circuit and simulates an end of life condition to prevent reset when miswired. In contrast to the line side miswire circuit, the load-side miswire protection circuit is not disabled after the device is properly wired and power is applied. Each time a device is removed from service and miswired during reinstallation, the load side miswire circuit will function to prevent reset. Thus, the present invention provides multi-use miswire protection.

Figure 3:
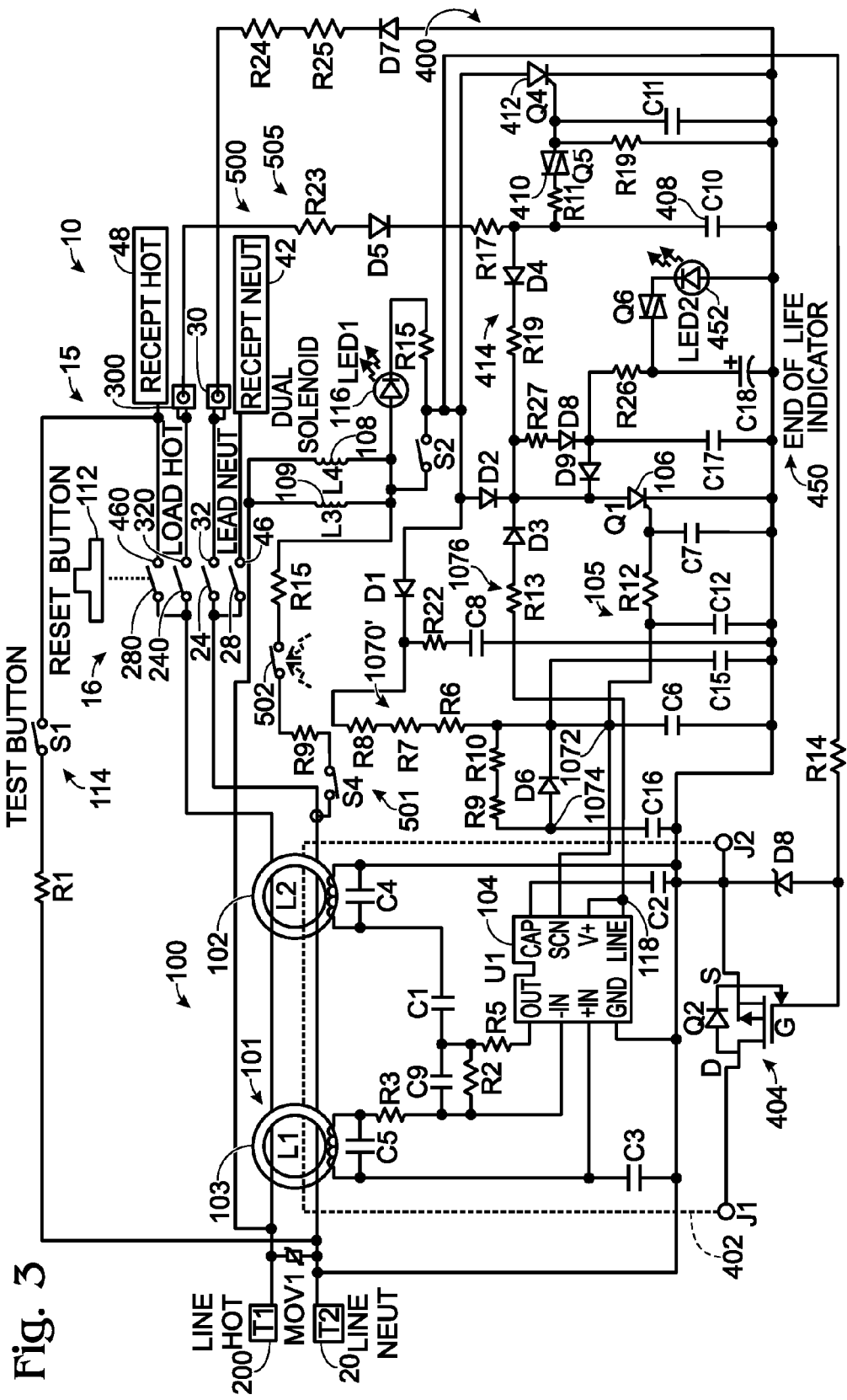
FIG. 3 is a schematic diagram of a protective electrical device in accordance with an alternate embodiment of the present invention.

In reference to FIGS. 1-3, the miswire protection circuit 500 includes a line side miswire circuit 501 that includes a switch S4 connected to the line neutral conductor; switch S4, resistors (R9, R15) and fusible element 502 are connected to line hot via solenoid 108. Again, all of these components are on the line side of circuit interrupter 16. In another embodiment of the present invention, the line-side miswire protective circuit 501 may be coupled to the line terminals (20, 200) without being in series with solenoid 108. In any event, the line side miswire protection circuit 501 simulates a ground fault such that the differential current transformer 101 creates a differential current output signal in excess of the GFCI trip threshold (which is typically about 6 milliamperes). Resistors (R9, R15) establish the magnitude of this differential current in accordance with Ohm's Law.

The line side miswire protection circuit 501 operates as follows. When device 10 is miswired and reset, the circuit 501 will generate the simulated fault and the device will trip (if the GFCI is not at EOL) in the manner described above. After the device is tripped and miswired, nothing visible happens because the current flowing through the fault resistance (R9, R15) is interrupted when the device trips. If one attempts to reset the device in the miswired condition, the device immediately trips out again, and this continues until such time as the device is wired correctly, i.e., when AC power is applied to the GFCI at the line terminals (20, 200). Thus, device 10 cannot substantially be reset until the device 10 is properly wired.

The estimated time it take for the fault resistance (R9, R15) to "clear" or burn out, or generate enough heat to open fusible element 52 is greater than 50 ms. The trip time of the GFCI is less than or equal to about 25 msec. Thus, when device 10 is miswired, the fault result resistance (R9, R15) does not have enough time to generate an open circuit condition before the circuit interrupter 16 is tripped. Once the device is properly wired, the device will trip once and either the fault resistor(s) or the fusible element 52 will open circuit to thereby disable the miswire circuit 501 permanently (the fault resistance is on the line side of circuit interrupter 16 and current continues to flow through fault resistance despite circuit interrupter 16 being open).

The fusible element 502 or the resistor(s) are open circuited within a predetermined time frame (i.e., typically about 50 msec). This may be implemented by selecting one or more resistors (e.g., R9, R15) having a power rating that is greatly exceeded by the current such that the resistor or resistors open. Another option is to provide a fusible element 502 in series with the fault resistance (R9, R15) with a properly selected $I^2 t$ rating so that the fusible element blows instead of the fault resistance (R9, R15.) Once the fusible element is melted, the present invention may also include a release mechanism that dislodges the fusible element 502, creating an open circuit condition. Another option is to position resistors R9, R15 near the fusible element 502. They generate enough heat when the device is properly wired to open the fusible element. Fusible element 502 may be realized as a link of solder that melts open. In each of the alternate embodiments described above and contemplated by the present invention, once the device has been properly wired such that AC power is connected to the line terminals and the circuit 501 cleared, the device 10 may be reset to provide its normal protective functions.

Two interesting issues that arise in conjunction with the above described line side miswire protection circuit 501 relate to (1) performing required Underwriters Laboratories (UL) tests; and (2) keeping circuit 501 intact during manufacturing and testing. In particular, various tests showing that the device conforms to UL standard 943 must be performed during manufacturing of the protective device. In reference to the first point, the differential current produced by the fault resistors (R9, R15) cannot affect the test results. With respect to the second point, manufacturing testing cannot cause the miswire protection circuit 501 to clear. One solution is to place a switch S4 in series with the fault resistance (R9, R15). Switch S4 is open until testing is completed and closed just before the device 10 enters the stream of commerce.

Switch S4 may be implemented using a flexible conductive spring arm that is flexed against a contact on the top side of the printed circuit board to complete the miswire circuit 501. A hole is formed in the printed circuit board directly below the spring arm of switch S4. Another hole is formed in the plastic back body of the GFCI device that is in alignment with the hole formed in the printed circuit board. Subsequently, when the GFCI under test is loaded into a piece of test equipment designed to perform the required manufacturing tests, a mechanical test probe is guided through the two aforementioned holes to open switch S4. The test probe engages the spring arm of switch S4 and pushes it away from the contact to open the line side miswire circuit 501. Once this is achieved, manufacturing testing is performed without any of the above identified issues being a factor. The last test performed on the GFCI device in the test sequence is to close switch S4, miswire the device, and apply AC power. This last test, of course, checks the integrity and operability of the line side miswire circuit 501.

In another embodiment of the present invention, switch S4 is implemented using solder. After the manufacturing tests have been performed, the solder is introduced through a port in the housing to short the terminals of S4 together. Afterwards, the port may be sealed with a door piece.

To reiterate, the line side miswire circuit portion 501 becomes non-operational after the first time the device has been properly wired. The load side miswire protection circuit 505 is included to provide miswire protection during a subsequent reinstallation of device 10.

In reference to FIG. 1, the load side miswire protective circuit 505 includes a diode D3 in series with resistor R30 coupled between load hot terminal 300 and diac 410 of the watchdog circuit 400. The load side miswire protective circuit 505 also includes a diode D4 connected between load neutral terminal 30 and the cathode of SCR 412. As its name implies, the load side miswire circuit 505 derives power from the load terminals 30, 300. The load side miswire protection circuit operates as follows.

If the protective device 10 is properly wired and in the reset condition, then diode D3, resistor R30, and diode D4 conduct a current derived from the voltage across load terminals 30, 300 to charge the watchdog charging capacitor 408. Note that the load side charging path is a redundant charging path; the charging circuit 416 described above provides charging capacitor 408 with charging current on the positive half-cycle of the AC line cycle. Thus, the watchdog circuit 400 receives charge from the line side and the load side when the device 10 is properly wired and reset. The watchdog circuit 400 only receives charge from the line side charging circuit 416 when device 10 is properly wired and the circuit interrupter 16 is in the tripped condition because there is no voltage across the load terminals and D3, R30 and D4 are not providing charging current; line side path 416 continues to do so. On the other hand, the watchdog circuit 400 only receives charge from the load side when device 10 is reverse wired and the circuit interrupter 16 is in the tripped condition because there is no voltage across the line terminals. Of course, it is in this last state (miswired and tripped) that the load side miswire protection circuit 505 is needed.

When device 10 is in the miswired and tripped state, the watchdog circuit 400 is powered by the load side miswire circuit portion 505 and is configured to respond to a miswired condition in the same way it responds to an end of life condition (when properly wired). In this state, current flows from load hot to load neutral via the circuit path that includes diode D3, resistor R30 and diode D4 to thereby charge capacitor 408. In the description provided above, it was noted that the line side charging circuit 416 charged on the positive half cycle and SCR 106 discharged capacitor 408 on the negative half cycle. In this state (miswired and tripped), SCR 106 cannot be turned ON because the circuit interrupter 16 contacts are open. Thus, the load side miswire circuit continues to charge capacitor 408 until the breakover voltage of diac 410 is attained; at this point, diac 410 is activated but SCR 412 cannot turn on due to the fact that there is no anode voltage. Once a user depresses reset button 112, the circuit interrupter is closed and now there is anode voltage. The signal through diac 410 then turned SCR 412 ON. With SCR 412 turned on, the solenoid 108 is energized and the circuit interrupter 16 is tripped. The above stated sequence repeats every time reset is attempted ad infinitum. At some point, the user will recognize the repeated tripping of the circuit interrupter means that the device is improperly wired (miswired). Unlike miswire circuit portion 501, there is no fusible element in the load side miswire protection circuit 505. Thus, the load side miswire circuit portion 505 affords miswire protection after the initial installation is complete and the line side miswire circuit 501 is cleared. In fact, the load side miswire circuit may be employed for repeated reinstallations.

In yet another embodiment of the present invention, one end of the load side miswire circuit 505 may be connected across the face terminals (42, 48); this configuration will operate in a manner that is similar to what has been described above.

Those skilled in the art will understand that many GFCIs, once installed, may never be reinstalled. Thus, the combination of the line side miswire circuit 501 and the load side miswire circuit 505 provides redundant miswire protection for the initial installation. If the device is in the tripped and miswired state, the line side miswire circuit 501 is configured to trip the circuit interrupter 16 via SCR 106. The trip signal is delayed through filter 105 by about 25 msec. The load side miswire circuit 505 has no such delay signal and so is the first to provide the trip signal. If there is an EOL condition in either miswire circuit, the other will still provide miswire protection. However, only line side circuit 501 assures complete miswire protection during the first installation; circuit 505 provides protection only when the device is in the tripped state. Thus primary miswire protection is afforded by circuit 501 whereas secondary protection is afforded by circuit 505.

Those skilled in the art will also understand that the presence of a load side circuit implicates certain UL test requirements. For example, the present Underwriters Laboratories standard includes a high voltage dielectric test requirement. This test is performed by applying a high voltage potential between the hot terminals 200, 300 and neutral terminals 20, 30, or both sets of terminals at the same time, while the device 10 is in the tripped state. The typical dielectric test voltage is 1500 VAC. The device fails the test if a leakage current greater than about 0.5 mA is detected. Thus, the load side miswire circuit must be sufficiently isolated from the line side terminals in order for device 10 to pass this test.

The required isolation is achieved by the combination of diode D3, resistors R17 and R30, auxiliary switch S2 and SPDT switch S3. In one embodiment of the invention, resistors R17, R30 are chosen to have resistance values greater than 1 MOhm. For example, resistors R17, R30 may have resistance values of 1.5 MOhm. Diode D3 may be selected to have a break-over voltage greater than 1500 Volts such that there is little or no current passing through it in the reverse direction. In the tripped state, SPDT switch S3 disconnects the neutral connection of the watchdog circuit 400 (e.g., SCR 412 cathode) from line neutral. Diode D4 isolates terminals 20, 30 during the reset state. Without diode D4, note that terminals 20, 30 would be directly connected by switch S3 creating a simulated grounded neutral condition. Moreover, if enough load current was diverted through the short circuit, a ground fault condition could be created. Either condition would cause the device to nuisance trip.

In reference to FIGS. 1-3, the protective device 10 includes an indicator circuit 116 having LED1 in series with an impedance. The indicator circuit 116 provides multiple indicator meanings: when the device is properly wired, LED1 functions as a trip indicator; and when the device is miswired, LED1 functions as a miswire indicator. A more detailed explanation of the indicator circuit 116 is as follows.

In reference to FIG. 1, when the device 10 is wired properly, i.e., power from the supply source is connected to the line terminals, and the device is in the reset condition, indicator LED1 is OFF because the coupling contacts S3 are open and such that resistor R12 and indicator LED 1 are disconnected from the line terminals 20, 200. As a result, there is little or no voltage across LED 1 and resistor R12. If the GFCI trips for any reason, contacts S3 close such that the resistor R12 and LED1 are connected to the line terminals (20,200); as a result, LED1 is illuminated. When the device is reset, contacts S3 again decouple indicator LED1 from the line terminals, so the indicator again turns off. When the device is miswired, indicator LED1 is always OFF. When the device is in the reset condition and miswired, contacts S3 are open (turning LED1 OFF). When the device is tripped and miswired, there is no line voltage across the line terminals because the circuit interrupter 16 is tripped (and open).

The indicator circuit 116 is described above as a visual indicator, but the present invention should not be construed as being limited to visual indication. In other embodiments of the invention, indicator LED1 may be replaced by, or supplemented with, an audible indicator. In other alternate embodiments of the present invention, the indicator 116 may provide a non-steady form of indication, e.g., a flashing visual indication and/or a beeping audible indication.

Device 10 also includes one or more surge suppression circuits that protect the device circuitry from voltage surges propagating in the electrical distribution system. One typical cause of a surge event is lightning. In reference to FIG. 1, a MOV1 is disposed across the line terminals (20, 200). Surge suppression MOV1 limits the voltage across line terminals (20,200) to a predetermined value. A surge event, such as a lightening strike my propagate voltages that might otherwise be large enough to damage device 10. Those skilled in the art will appreciate the fact that MOV1 can be located elsewhere in the device and provide similar benefits. For example, MOV1 may be disposed across the load terminals (30, 300) or the face terminals (42, 48).

Although the surge suppressor has been symbolized as a metal oxide varistor (MOV), those skilled in the art will recognized that the MOV1 may comprise a plurality of surge suppression devices connected in series or in parallel. For example, a plurality of metal oxide varistors may be employed in both series and parallel configurations. Moreover, a metal oxide varistor may be connected in parallel with a spark gap, capacitor or any other suitable type of surge suppression device.

As contemplated by the present invention and depicted in FIG. 1, a surge suppressor (e.g., MOV) may be disposed within the device at a location other than across the line terminals. This arrangement may be employed to take advantage of certain device synergies or to merely protect a limited portion of the GFCI circuit that is vulnerable to surge events. For example, the surge suppressor MOV2 shown in FIG. 1 is configured to protect GFCI 100 including upstream miswire circuit 501. With respect to the device synergies mentioned above, MOV2 is located behind the trip solenoid 108. One benefit of this arrangement relates to the fact that the inductive reactance of the solenoid 108 effectively decouples MOV2 from the line terminals during all or a portion of the voltage surge event. Because of the impedance characteristic of solenoid 108, MOV2 is required to dissipate considerably less energy. The energy reduction translates to a substantially reduction is movistor size, i.e., from 12 mm to 7 mm. In accordance with the teachings of the present invention, surge suppressors MOV1 and MOV2 may be employed together (FIG. 1) or separately.

As embodied herein and depicted in FIG. 2, a schematic diagram of a protective electrical device in accordance with an alternate embodiment of the present invention is disclosed. This embodiment is similar to the one depicted in FIG. 1. One difference is that charging circuit 416 has been omitted from the device of FIG. 2. While the watchdog circuit 400 of FIG. 2 operates in a manner much like the watchdog circuit of FIG. 1, the charging path is now entirely associated with the load terminals. The charging path includes resistor R23, diode D5, and resistor R17 disposed between the load hot terminal 300 and charge capacitor 408. When the device is in the reset state and properly wired, the watchdog circuit 400 provides end-of-life protection in the manner described above. If the device is miswired, i.e., when the AC source voltage is connected to the load terminals, the charging circuit comprises resistor R23, diode D5, resistor R17, diode D7, and resistors R25 and R24 connected across the load terminals (30,300). Thus, capacitor 408 is charged and SCR 412 of the watchdog circuit 400 will energize solenoid 108 to thereby trip the circuit interrupter 16 in response to a miswire condition, when reset is attempted. In other words, the watchdog circuit prevents reset.

Another difference between the embodiments of FIG. 1 and FIG. 2 is that the device depicted in FIG. 2 does not include SPDT switch S3; thus, there are no contacts serving to isolate the line from the load when the device 10 is in the tripped state. However, isolation between load hot terminal 300 and line terminals (20,200) is fully provided by resistors R17, R23, and diode D5. Similarly, resistors R24, R25, and diode D7 fully isolate the line neutral terminal 20 from the load neutral terminals 30. Diodes D5 and D7 have breakover voltages that provide isolation during the half cycles (of the AC line cycle) in which they are reverse biased. In the neutral isolation circuit, note that the resistors R24, R25 have a combined resistance that is greater than about 500 KOhms, which is less than the 1.5 MOhms employed in FIG. 1. The diode D7 permits the combined resistance to be somewhat reduced (relative to FIG. 1) while still passing the dielectric test. The combined resistances in the hot isolation circuit (i.e., resistors R17, R23) may be different than the combined resistance of resistors R24, R25 (neutral isolation circuit). The reason for the difference relates to the time constant governing the charging of the watchdog circuit 400. In particular, resistors R17, R23 govern the charging time constant of capacitor 408 when the device 10 is properly wired and reset.

Another difference in the circuit depicted in FIG. 2 is that indicator 116 is connected across auxiliary switch S2 since it is not being relied upon for isolation. The indicator circuit 116 depicted in FIG. 2 is illuminated when the device 10 is properly wired and in the tripped condition.

Another difference in the circuit depicted in FIG. 2 is that surge suppressor MOV2 is coupled to the hot line terminal 200 by way of the solenoid 108 and the auxiliary switch S2. Like the indicator circuit 116, MOV2 is connected across the auxiliary switch S2. Again, this is possible because the auxiliary switch is not being relied upon for isolation in FIG. 2. Like FIG. 1, MOV2 is connected differentially such that if it develops a sufficient leakage current at end of life, it will be sensed by transformer 101 and detected by detector 104. Detector 104, of course, will signal SCR 106 to trip the device. Thus, the differentially connected MOV 2 provides another means for detecting an EOL event. Moreover, because the device 10 is tripped, solenoid burnout is prevented.

In reference to FIG. 2, device 10 includes a dual power supply 1070. As the name suggests, the dual power supply 1070 includes two power supply portions; power supply portion 1072 and power supply portion 1074. Dual power supply 1070 is configured to provide power to the supply terminal 118 of detector 104. Dual power supply 1070 includes a diode D1 that is connected to line hot via solenoid 108 and the parallel circuit that includes indicator 116 and auxiliary switch S2. Diode D1 is further connected to power supply portion 1072 including resistor R22 disposed in series with capacitor C8. Resistor R22 and capacitor C8 are disposed in parallel with resistors R8, R7 R6 and parallel capacitors C15 and C6. Power supply portion 1074 includes resistors R9, R10, and R11. R11 is connected to resistor R8 and resistor R9 is connected to power supply 1072 via diode D6.

As an initial point, the GFCI 100 is configured to interrupt circuit interrupter 16 during the positive half-cycle of the AC line cycle. In order to meet the trip time requirements, power supply portion 1072 is configured to charge to the full supply voltage in less than about 2 milliseconds whereas power supply portion 1074 takes longer to come up to full charge. The purpose of supply portion 1074 is to sustain the supply voltage during the negative half cycles when diode D1 is reverse biased and not providing energy. Power supply portion 1074 charges and discharges in accordance with a time constant that is approximately 15 milliseconds. Note that supply portion 1072 is slaved via diode D6 to supply portion 1074; thus, it is discharged at the same rate as supply portion 1074.

The dual power supply provides for certain modifications to the grounded neutral test circuit. In the embodiment of FIG. 2, the timing resistor R14 is arranged such that turn FET 404 is turned ON for a substantial portion of the negative half cycle. One reason for increasing the time duration of the simulated fault signal generated by loop 402 relates to improving the efficacy of the self-test detection. One drawback to this approach relates to the duration of the magnetic flux in core 103. Specifically, if the magnetic flux in core 103 carries over into the subsequent positive half cycle, the resultant sensor output would cause detector 104 to improperly turn SCR 106 ON and nuisance trip the device 10. The dual power supply 1070 substantially prevents nuisance tripping by collapsing the power supply output voltage before the conclusion of the negative half cycle.

One reason why the collapsible power supply voltage prevents nuisance tripping relates to the inability of grounded neutral oscillations to persist in the absence of the power supply output voltage. Even when FET 404 is turned ON, there is substantially no magnetic flux in core 103 once the power supply voltage collapses. Thus, if the power supply voltage is collapsed before the conclusion of the negative half cycle, the grounded neutral oscillations that otherwise would be generated by FET 404, cannot carry over into the positive half cycle. Thus, the dual power supply 1070 prevents nuisance tripping.

The details regarding the collapsible power supply voltage are as follows. During the self test, the SCR 106 is turned ON at about 225°-280° of the AC line cycle (i.e., during a portion of the negative half cycle). As a result, capacitor C6 and capacitor C16 (by way of diode D6) are dump-discharged via discharge circuit 1076 and SCR 106 to thereby collapse the output voltage of the power supply. The discharging process occurs gradually because of the C16, R13 time constant. Accordingly, when FET 404 is turned ON, the grounded neutral transmitter 102 produces an oscillating signal that is a function of the full power supply voltage. As the power supply voltage gradually collapses in accordance with the aforementioned RC time constant, the magnitude of the oscillating signal produced by the grounded neutral transmitter 102 also diminishes. In response, the grounded neutral simulation current propagating around loop 402 diminishes. Finally, the flux in core 103 diminishes such that the sensor signal provided to detector 104 does not represent a fault condition. This process occurs before the conclusion of the negative half cycle; thus, little or no flux is present in core 103 at the start of the subsequent positive half cycle. In one embodiment of the present invention, the C16, R13 time constant is about 0.5 milliseconds and the period of the grounded neutral oscillation is about 0.15 milliseconds.

In FIG. 1, the self test nuisance trip issue was addressed by controlling by the RC time constant of capacitor 406 and resistor R14, which in turn, controlled FET timing. In FIG. 2, the input terminal of FET is only coupled to the line terminal by via resistance R14 because the self test nuisance trip issue has been addressed by reconfiguring the power supply. Specifically, the resistor R14 is coupled to the hot line terminal 200 by way of solenoid 108. Thus, like MOV2, FET 404 is also protected by the impedance of the solenoid 108 during a surge event. Moreover, FET 404 is additionally protected by surge suppressor MOV2.

As embodied herein and depicted in FIG. 3, a schematic diagram of a protective electrical device in accordance with an alternate embodiment of the present invention is disclosed. The embodiment of FIG. 3 is similar to the embodiment of FIG. 2, except that it includes an end of life (EOL) indication circuit 450 as well as a dual solenoid arrangement. The embodiment of FIG. 3 also includes a modified dual power supply.

The EOL indication circuit 450 includes a charging capacitor 452 coupled to diac 456 and LED 458. The charging capacitor 452 is charged by charging circuit 454 and operates in much the same way that the charge capacitor 408 operates in the watchdog circuit 400. Power is derived from the load hot terminal via diode D5 and resistor R23; these components are coupled to diode D4, resistors R19 and R27, Diode D8, and resistor R26. As noted above, the self-test circuit 402 is turned ON every negative half cycle to test the GFCI 100 circuitry. When SCR 106 is turned ON every negative half cycle, capacitor 452 discharges to a voltage at or near zero. When there is an end of life condition in the GFCI circuitry, SCR 106 will not turn ON and capacitor 452 will not be discharged. Thus, capacitor 452 continues to accumulate charge until it reaches the breakover voltage of diac 456; thus, diac 456 turns on and LED 458 emits light. Subsequently, the current through LED 458 drains the voltage on the capacitor, diac 456 turns OFF and LED 458 ceases to emit light. Because the GFCI is at EOL, the charge again accumulates on capacitor 452 and the cycle repeats. Thus, LED 458 functions as a flashing end of life indicator. In an alternate embodiment, LED 458 is replaced by an annunciator that makes an audible beeping sound at end of life.

The device of FIG. 3 includes two redundant trip solenoids 108, 109 that are capable of tripping circuit interrupter 16 when energized by SCR 106 or SCR 412. The redundancy ensures that if one of the solenoids has an open-circuited end of life condition, device 10 will continue to afford protection because the second solenoid is operative. Perspective views of the dual solenoid embodiments of the present invention are shown in FIGS. 7 and 8.

The dual power supply 1070' of FIG. 3 is similar to the power supply 1070 of FIG. 2, with the exception that it includes only one set of resistors to charge the supply capacitors C6 and C16.

As embodied herein and depicted in FIG. 4, a diagrammatic depiction of a watchdog circuit for a protective electrical device in accordance with another alternate embodiment of the present invention is disclosed. The embodiment of FIG. 4 is generalized to apply to different protective devices such as ground fault circuit interrupters (GFCIs), ground-fault equipment protectors (GFEPs), arc fault circuit interrupters (AFCIs), or combination AFCI/GFCI. This list includes representative examples and is not meant to be exhaustive. Reference is made to U.S. Pat. No. 6,798,628, which is incorporated herein by reference as though fully set forth in its entirety, for a more detailed explanation of an AFCI device.

In reference to FIG. 4, device 600 includes a protective circuit 604 connected to a power supply 602. The protective circuit 604 is configured to detect a fault condition, whether it is a ground fault, grounded neutral fault, arc fault, etc. When the fault is detected, circuit 604 turns ON SCR 606 (or any suitable electronic switching device) to energize the solenoid coils 108, 109. The dual solenoids 108, 109 receive power from the line conductors to open electrical contacts 608. The electrical contacts 608 are arranged in a "sandwiched cantilever" configuration that is shown in greater detail in FIG. 10.

Device 600 also includes a miswire circuit portion 501 that includes resistors R9, R15, S4 and fusible element 502. The miswire circuit 501 in this embodiment is identical or similar to the previously described miswire circuits having the same reference numeral. When power is miswired to load terminals 30, 300 and the protective device is reset, the interrupting contacts 608 are tripped within about 25 milliseconds. Once AC power is connected the line terminals 20, 200, the fusible element 502 clears and interrupting contacts 608 may be reset. Solenoids 108, 109, of course, are designed not to burn out during the interval that SCR 606 is conductive, which interval is designed to be approximately 100 milliseconds. In this manner the protective functions described in FIG. 4 are provided without necessarily requiring a differential current transformer 101 in the construction of the protective device. If an electronic switching device other than an SCR is used, e.g., a bipolar transistor, the connections shown herein to the gate of the SCR would instead be made to the base of the bipolar transistor.

Watchdog circuit portion 4000 is similar to the previously described circuits of FIGS. 1-3. This circuit includes a fault generator 610 which is configured to generate an appropriate simulated fault condition, e.g., ground fault, ground neutral fault, arc fault, etc. Alternatively, generator 610 may be configured to perform a limited test that is directed toward testing those parts of device 600 considered to be most susceptible to failure. The watchdog circuit 4000 includes charge capacitor 408, diac 410, SCR 412 and discharge circuit 414; these components and their functionality have been described above in great detail. As before, the test signal causes SCR 606 to turn ON during the negative half cycles of the AC line cycle to discharge capacitor 408. When there is an end of life condition, SCR 606 is disabled and capacitor 408 reaches the breakover voltage of diac 410, such that SCR 412 turns ON to trip circuit interrupter contacts 608.

Device 600 also includes the load-side miswire circuit 505 previously described. As shown in FIG. 4, the miswire circuit 505 includes diodes D5, D9 and resistors R23, R24, R25; these components have functions that are identical or similar to the miswire circuit 505 described in the previous embodiments. Briefly stated, the watchdog circuit is configured to turn SCR 412 ON when the device 600 is at end-of-life or miswired upon reinstallation after circuit 501 has been cleared.

Device 600 also includes indication circuit 620. Indication circuit 620 is an alternate embodiment of the present invention and may be employed in any of the embodiments described herein. Like the previous indicator embodiment, indicator circuit 620 includes charging circuit 454, diac 456 and LED 458; these components have the same function described in the previous embodiment. Unlike the earlier indicator embodiment, circuit 620 is not connected across SCR 106 (606). Note that both the indicator circuit 620 and the watchdog circuit are responsive to charging capacitor 408. Thus, the voltage across the capacitor 408 is used to turn ON SCR 412 and activate the indicator LED1.

Referring to FIGS. 5A-5F, a set of timing diagrams for a watchdog circuit in accordance with the embodiments of FIG. 1 is disclosed. In FIG. 5A, waveform 700, represents the AC line cycle, i.e., the power source voltage across line terminals 20, 200. As noted previously, the AC line cycle includes positive half cycles 702 and negative half cycles 704. The waveform 706 represents the gate voltage of FET 404 which, as previously noted, is phase-shifted with respect to the power source waveform.

FIG. 5B shows the duty cycle of the FET 404. The term "duty cycle" as used herein refers to the time duration 708 when the FET is turned ON. Specifically, FET 404 is turned ON whenever the instantaneous gate voltage of FET 404 (i.e., 706) is more positive than the instantaneous voltage of the AC line voltage (i.e., waveform 700).

FIG. 5C depicts the output signal 710 of the differential transformer 101. Each time FET 404 is turned ON, the differential transformer 101 provides an oscillating signal 710 in response to the simulated grounded neutral condition. In other words, the transformer provides output signal 710 during time duration 708. The transformer output signal 710 includes a beginning portion 712 that coincides with the conclusion of the positive half cycle 702 (i.e., at the start of time duration 708). The transformer output signal 710 includes a middle portion 714 that coincides with the remaining portion of time duration 708 that occurs during a part of the negative half cycle 704. Ideally, the middle portion 714 would conclude as soon as FET 404 turns OFF. However, magnetic flux related to the oscillating signal 710 is still circulating in the core 103. As a result, a carry-over portion 718 of the signal 710 extends into the positive half-cycle 702. Taking this into account, FET 404 is turned off well before zero crossing 716 such that little or no carry-over signal 718 extends into positive half cycle 702.

FIG. 5D depicts the self-test duty cycle 720 of SCR 106; i.e., the time duration when SCR is turned ON during each negative half cycle portion 704. The phantom SCR duty cycles 726 represent those instances when the SCR 106 should have been turned ON, but failed to turn ON because of an end of life condition.

FIG. 5E depicts the voltage across charging capacitor 408 of watchdog circuits 400 (4000). Each time SCR 106 turns on, capacitor C10 is discharged in the manner shown. The discharge is represented by region 722. As noted, the SCR 106 turns OFF before positive half cycle 702 begins. The capacitor 408 voltage (see voltage 724) at the onset of each positive half cycle 702 is ideally at or near zero. The capacitor voltage is recharged during time period 723 which begins after the SCR duty cycle 720. However, when the SCR 106 fails to turn ON because of an end-of-life state (see phantom SCR duty cycles 726 in FIG. 5D), the capacitor 408 is not discharged (see period 727). Instead, the capacitor 408 continues to charge over a plurality of line cycles until it attains the diac breakover voltage 728.

FIG. 5F represents the EOL signal from SCR 412. As shown, SCR 412 is OFF until the breakover voltage 728 of diac 410 is attained. Note that watchdog circuit 400 is configured such that SCR 412 turns ON relatively early in the positive half cycle 702 (FIG. 5A) such that device 10 is tripped, the indicator is energized, or both. As noted above, device 10 will trip after each reset attempt when the device is at EOL.

Referring to FIGS. 6A-6G, a set of timing diagrams for a watchdog circuit in accordance with the embodiments of FIG. 2 and FIG. 3 is disclosed. Like FIG. 5A, FIG. 6A depicts a waveform 700 that represents the power source voltage across line terminals 20, 200. Again, it has positive half cycles 702 and negative half cycles 704.

FIG. 6B depicts the duty cycle 750 of FET 404. The term "duty cycle" as used herein refers to the time duration 750 when the FET is turned ON during the negative half-cycle 704 of the AC line cycle 700.

FIG. 6C represents the output signal 752 of the differential transformer 101 shown in FIGS. 2-3. Each time FET 404 is ON; differential transformer 101 provides an oscillating transformer output signal 752 in response to a simulated grounded neutral condition. The transformer output signal 752 does not have steady peak to peak amplitude; rather, transformer output signal 752 is characterized by a signal envelope 754. As shown in FIG. 6C, the amplitude diminishes in accordance with envelope 754 to near zero by the time zero crossings 716 are reached. Thus, transformer output signal 752 does not cross-over into the positive half cycles 702.

FIG. 6D depicts the self-test duty cycle 756 of SCR 106; i.e., the time duration when SCR is turned ON during each negative half cycle portion 704. The phantom SCR duty cycles 757 represent those instances when the SCR 106 should have been turned ON, but failed to turn ON because of an end of life condition.

FIG. 6E depicts the waveform 758 that is present on the line supply voltage pin 118 of fault detector 104. Immediately before the self-test duty cycle 756 of SCR 106 (FIG. 6D), the supply voltage is at a maximum. Once the SCR 106 turns ON, the line voltage waveform portion 759 depicts the collapsing line supply voltage on supply pin 118. As noted above, the power supply voltage 759 is bled through SCR 106 to approximately 0 Volts by the time of the zero cross 706 is reached. Note that the correspondence between the diminishing amplitude of the waveform 752 (FIG. 6C) and the collapsing power supply voltage 759. When SCR 106 is turned OFF during positive half cycles 702, the power supply output voltage 758 ramps up to voltage level 762.

FIG. 6F depicts the voltage across charging capacitor 408 of watchdog circuits 400 (4000). Each time SCR 106 turns on, capacitor 408 is discharged in the manner shown. The discharge is represented by region 764. As noted, the SCR 106 turns OFF before positive half cycle 702 begins. The capacitor 408 voltage at the onset of each positive half cycle 702 is ideally at or near zero. The capacitor voltage is recharged during time period 766 which begins after the SCR duty cycle 720. However, when the SCR 106 fails to turn ON because of an end-of-life state (see phantom SCR duty cycles 757 in FIG. 6D), the capacitor 408 is not discharged and continues to charge over a plurality of line cycles until it attains the diac breakover voltage 768.

FIG. 6G represents the EOL signal from SCR 412. As shown, SCR 412 is OFF until the breakover voltage 768 of diac 410 is attained. Note that watchdog circuit 400 is configured such that SCR 412 turns ON relatively early in the positive half cycle 702 (FIG. 5A) such that device 10 is tripped, the indicator is energized, or both. As noted above, device 10 will trip after each reset attempt when the device is at EOL.

Referring to FIG. 7, a perspective view of a dual solenoid 800 in accordance with an embodiment of the present invention is disclosed. Solenoid 800 includes a solenoid housing 802 which accommodates solenoid coils 108, 109. The solenoid housing 800 includes pins 8020 which are configured to be inserted into a printed circuit board such that flat surface 8022 is adjacent the surface of the printed circuit board. The solenoid coils 108, 109 are separated by an insulator barrier 812. The barrier 812 provides dielectric isolation between the two solenoids as well as a convenient location for terminal pins 804, 806, 808, and 810 disposed therein. The start lead of solenoid 109 is connected to pin 804 and fed through pocket 814 which provides additional insulation between the start lead and the outer layers of the solenoid coil 109. The finish lead of coil 109 is connected to terminal pin 808. Solenoid 109 is wound in a counter-clockwise direction (represented by arrow A) while solenoid 108 is wound in the opposite direction (arrow B). The two solenoids are connected in parallel and are energized at the same time to trip the device (See, e.g., FIG. 3). Thus, the magnetic fields of the solenoid coils (108, 109) must be in the same direction such that they do not cancel each other. The start lead of coil 108 is terminated by terminal pin 810; the coil wire is fed through pocket 816 and then wound in the clockwise direction B. The finish lead of coil 108 is terminated by pin 806. Thus, solenoid 108 is wound as a mirror image of solenoid coil 109 and the magnetic fields of the solenoid coils (108, 109) radiate in the same direction.

Referring to FIG. 8, a perspective view of a dual solenoid 800 in accordance with alternate embodiments of the present invention is disclosed. Again, coil 108 and coil 109 are accommodated by housing 802. Instead of employing terminal pins 806 and 808, the finish lead of coil 108 and the finish lead of coil 109 are connected to terminal pins 804, 810, respectively.

Figure 9:
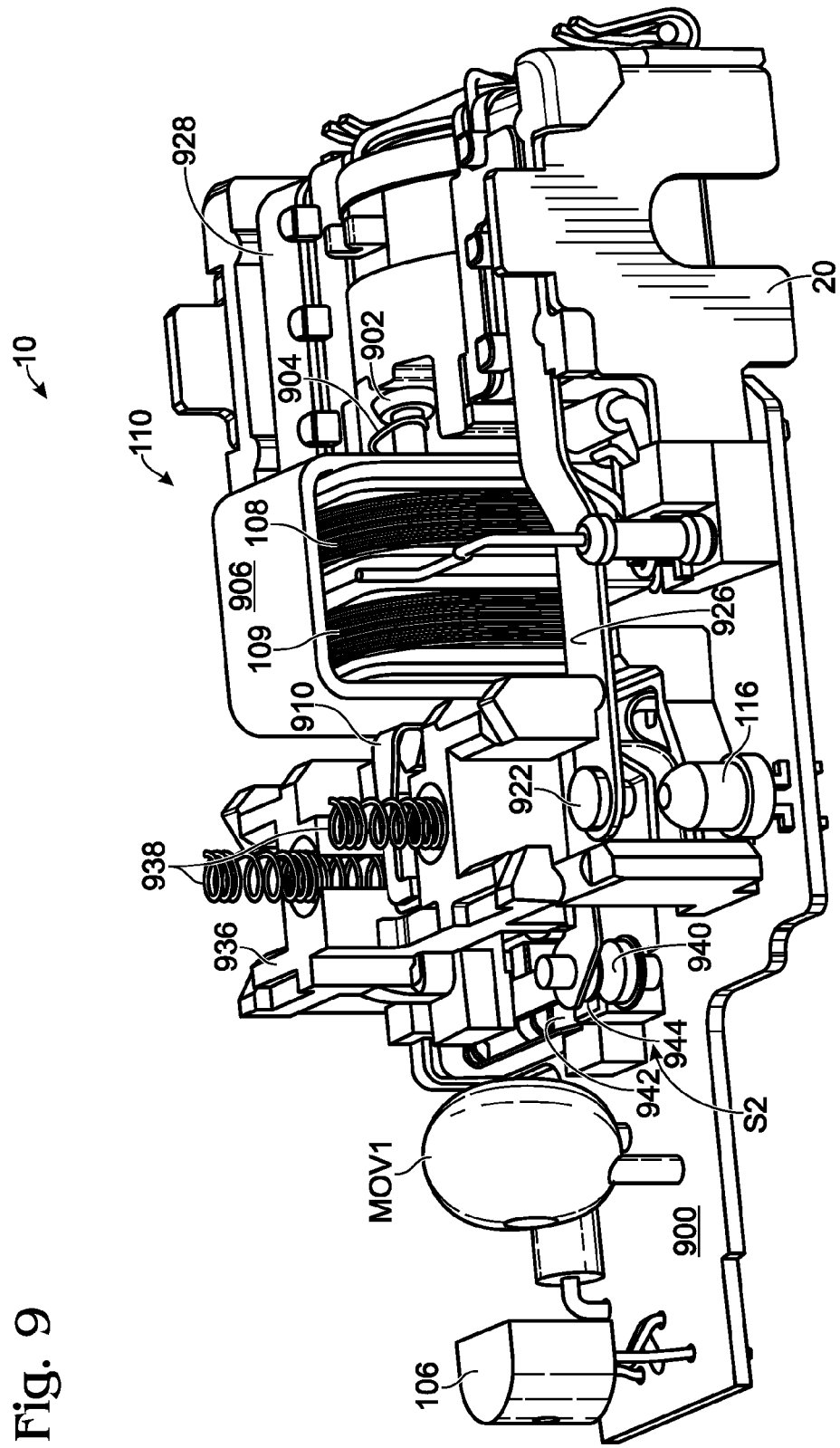
FIG. 9 is a perspective view of a printed circuit board assembly in accordance with an embodiment of the present invention.

Referring to FIG. 9, a perspective view of a printed circuit board assembly (PCBA) 900 in accordance with an embodiment of the present invention is disclosed. The PCBA 900 includes one of the solenoid assemblies 800 shown in FIG. 7 or 8. The portion of the housing 802 of the solenoid assembly that mounts to the PCB 900 is disposed under the latch block 936. PC board 900 also accommodates the terminal pins 804, 810 (and 806, 808 if employed) as well as the various electronic components that have been noted in the descriptions of FIGS. 1-4. For example, components such as MOV1, SCR 106, and LED 116 are readily seen in FIG. 9. When one (or both) solenoids (108, 109) are energized, a coil assembly armature 902 becomes attracted by the magnetic field generated by the coil(s) and causes the return spring 904 to be compressed. In an alternate embodiment, the amount of magnetic force is intensified by adding a frame 906 made out of magnetic material to the solenoid assembly. Ultimately, the armature 902 exerts a force on latch 910 such that the reset pin 912 (See FIG. 10) becomes dislodged from latch element 910. This action trips the circuit interrupter 16. Portions of circuit interrupter cantilevers 926 and 928 can be seen in FIG. 9. The auxiliary switch S2 (with contacts 940 and 944) is also depicted in this view.

Figure 10:
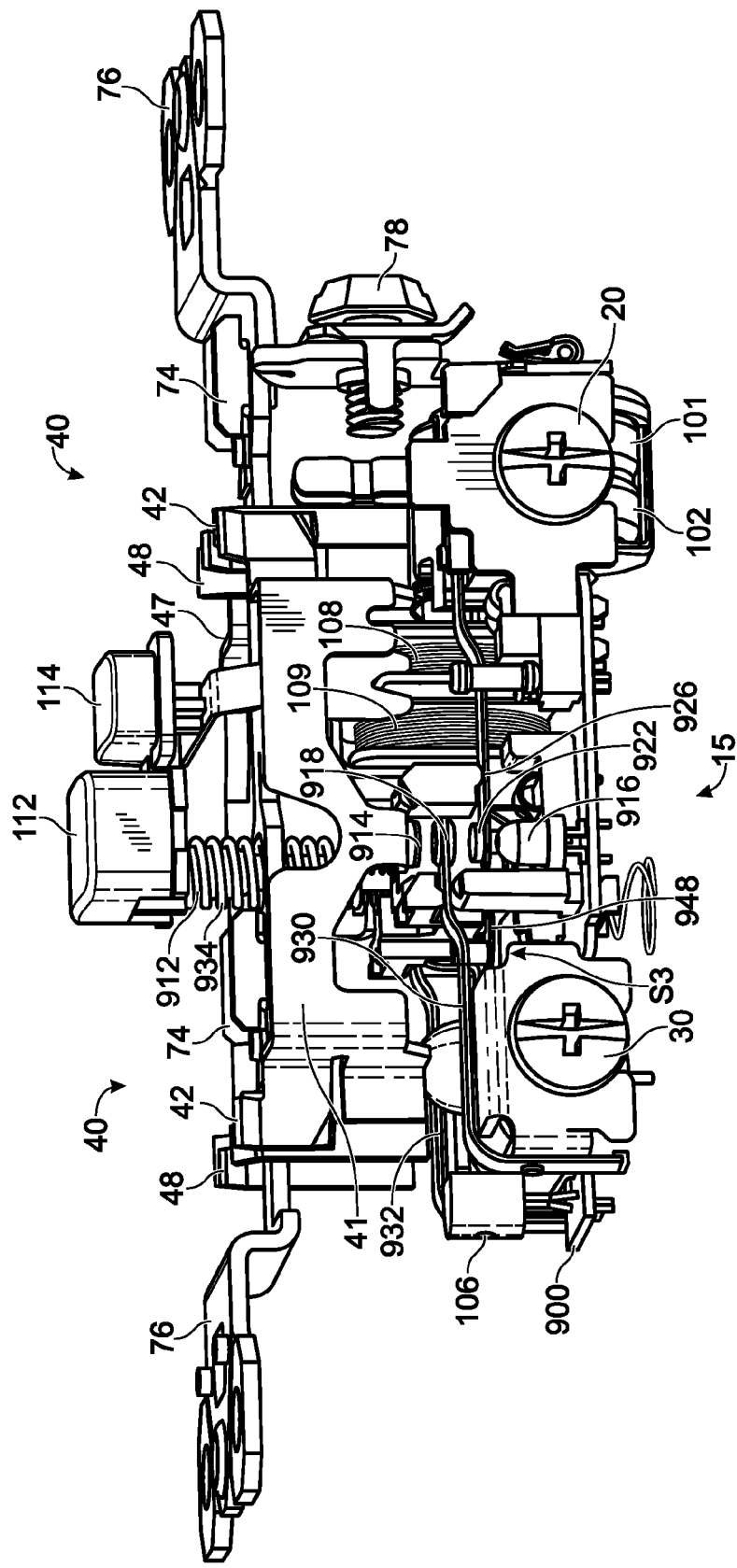
FIG. 10 is a perspective view of a partially assembled protective device in accordance with the embodiment depicted in FIG. 9.

Referring to FIG. 10, a perspective view of a partially assembled protective device assembly in accordance with the embodiment depicted in FIG. 9 is disclosed.

Referring to FIG. 10, a perspective view of the electrical wiring device 10 is shown with the cover, back body member and separator portion removed. This view is similar to FIG. 9 with additional components added. In this view, the neutral side of the device 10 is depicted since the line neutral terminal 20 and the load neutral terminal 30 can be seen in the foreground. Of course, the line hot terminal 200 and the load hot terminal 300 are on the opposite side and cannot be seen in this view.

FIG. 10 also shows the neutral receptacle terminal structure 41 and the hot receptacle terminal structure 47 disposed over the PCBA 900. The receptacle terminal structures (41, 47) provide a set of receptacles 40 at each end of the device. Each receptacle set 40 includes neutral contacts 42 and receptacle hot contacts 48. Each receptacle set 40 may also provide a receptacle ground contact 74 which is electrically connected to outlet box mounting portions 76 and ground screw 78. In an alternate embodiment (not shown) contacts 74 are connected to ground screw 78 but are electrically isolated from mounting portions 76.

Because the receptacle terminal structures (41, 47) are shown in FIG. 10, the circuit interrupter 16 is more clearly seen in this view. For example, the receptacle terminal structure 41 includes a fixed neutral contact 914 which is aligned with neutral load contact 918 and the neutral line contact 922. Note that the neutral load contact 918 is a two-way contact that is disposed on flexible cantilever member 930, which is in turn, connected to neutral load terminal 30. The line neutral contact 922 is connected to flexible member 922 which is also connected to neutral line terminal 20. Contacts 914, 918, and 926 are closed when circuit interrupter 16 is reset. Reset is performed in the following manner.

The latch 910 (FIG. 9) is shown to include a cylindrical hole that accommodates the reset pin 912 (attached to reset button 112). When the device is in the reset condition, an escapement on the reset pin engages an edge of the latch 910 such that the make springs 934 bear against reset button 112. Of course, the latch 910 is attached to the latch block 936 (See FIG. 9) and the reset pin 912 lifts the latch block 936 upwardly. In turn, the latch block assembly 936 lifts cantilever 926 upwardly such that contact 922 engages contact 918. The pressure exerted by the make springs 934 deflects cantilevers 926 and 930 until contacts 922, 918 are pressed against fixed contact 914 to establish reset. As noted in the discussion of FIG. 9, when solenoid(s) 108 (or 109) are energized, the latch mechanism 936 is moved by the solenoid armature such that contacts 914, 918, and 922 are released to trip device 10.

In an alternate embodiment, cantilevers 926 or 930 are pre-biased so the contacts are in the reset position without assistance from latch block assembly 936. The break springs are able to overcome the pre-bias and drive the contacts by way of the latch block to the tripped position. In another embodiment, cantilevers 926 or 930 are pre-biased in the tripped position without assistance from the latch block. The make spring is able to overcome this pre-bias and, by way of the latch block, drive the contacts to the reset position.

As noted above, FIGS. 9 and 10 show the neutral side of the device 10. The hot side of the circuit interrupter mechanism 16 is a mirror image of the neutral contact structure and operates in an identical manner that is in synchronism with the neutral contact structure.

Reference is made to U.S. Pat. Nos. 6,621,388 and 7,173,799 which are incorporated herein by reference as though fully set forth in their entirety, for a more detailed explanation of the circuit interrupter mechanism 16. Further, those skilled in the art will appreciate the fact that the invention applies to other circuit breaker configurations such as those depicted in these references.

Decoupling switch S3, which is discussed in the description of FIG. 1, includes a cantilever 948 controlled by latch block 936. Thus, circuit interrupter 16, switch S2, and switch S3 are all controlled by the operation of the reset button 112 and latch block 936. In another alternate embodiment, circuit interrupter 16, switch S2, and switch S3 are configured to open and close in a predetermined sequence. For example, circuit interrupter 16 may be opened or closed before a corresponding action by switch S3 is performed.

Auxiliary switch S2, described in conjunction with FIG. 9, is also driven by latch block assembly 936 between the open or closed positions. In an alternate embodiment the auxiliary switch cantilever 942 is pre-biased in the closed position and does not require assistance from latch block 936 to close. Alternatively, cantilever 942 may be pre-biased in the open position and not require assistance from the latch block 936 to be in the open state.

Figure 11:
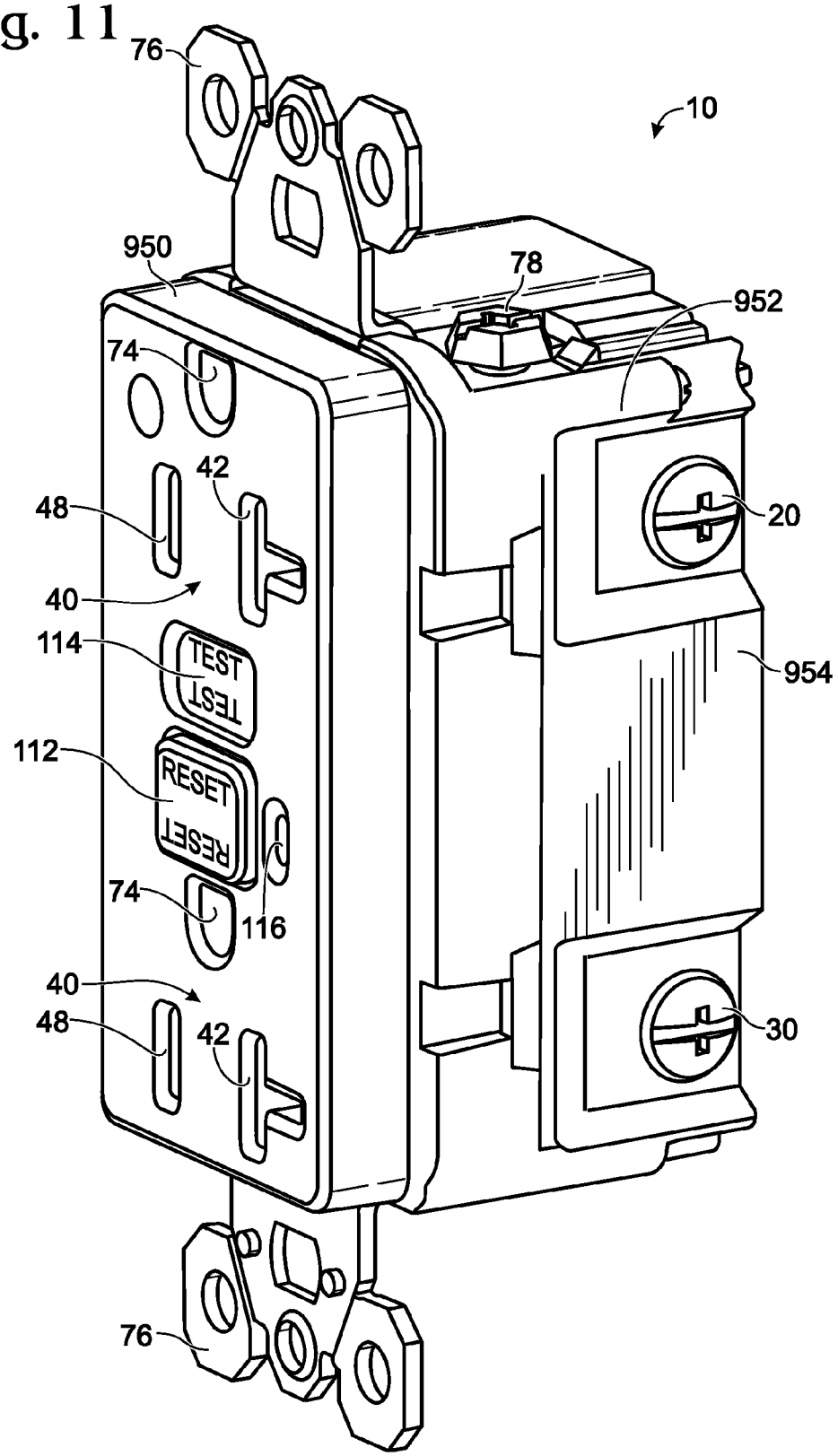
FIG. 11 is a perspective view of a fully assembled protective device in accordance with the embodiment depicted in FIG. 9 and FIG. 10.

Referring to FIG. 11, a perspective view of a fully assembled protective device in accordance with the embodiment depicted in FIG. 9 and FIG. 10 is disclosed. The assembly shown in FIG. 10 is shown in an enclosure consisting of a front cover 950, separator 952 and back cover 954. Separator 952 is disposed between some of the components in FIG. 10 but omitted for reasons of clarity.

Figure 12:
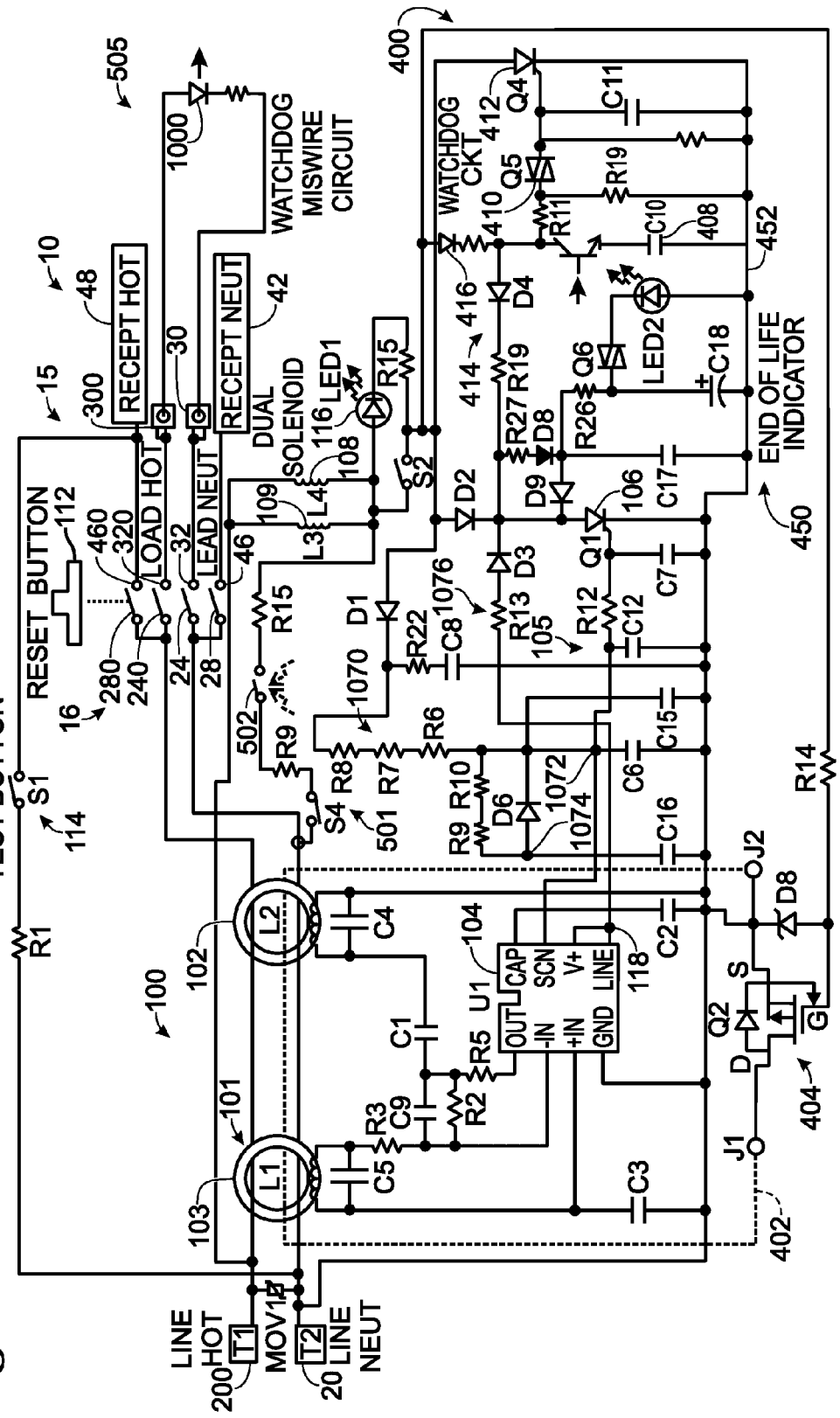
FIG. 12 is a schematic diagram of a protective electrical device in accordance with yet another embodiment of the present invention.

As embodied herein and depicted in FIG. 12, a schematic diagram of a protective electrical device in accordance with yet another embodiment of the present invention is disclosed. FIG. 12 is very similar to the embodiment shown in FIG. 3. FIG. 12 includes an alternate miswire circuit portion 505. Specifically, FIG. 12 includes an opto-isolator 1000 connected across load terminals 30, 300. If the device 10 is tripped and powered by the load terminals (30, 300), the opto-isolator 1000 is configured to charge the capacitor 408 until the breakover voltage of diac 410 is reached. When the device is momentarily reset, diac 410 will again turn SCR 412 ON. Because the device is reset, the SCR 412 will cause the circuit interrupter 16 to trip. This cycle keeps repeating and each time the device 10 is reset, the device will be tripped. The cycle will continue until the device is properly wired. Note also that the opto-isolator 1000 provides electrical isolation between the line terminals and the load terminals. The transmitter portion and receptor portions of the isolator may be contained in the same housing, or located in separate housings spaced away from each other within a predetermined distance.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring device for use in an electrical distribution system including a plurality of line conductors coupled to a source of AC power and a plurality of load conductors, comprising:

a housing including a plurality of line terminals and a plurality of load terminals, the plurality of line terminals being configured to terminate the plurality of line conductors and the plurality of load terminals being configured to terminate the plurality of load conductors, the electrical wiring device being in a properly wired condition when the plurality of line conductors are terminated to the plurality of line terminals and in a miswired condition when the plurality of line conductors are terminated to the plurality of load terminals, an internal line conductor and an internal neutral conductor being disposed in the interior of the housing and coupled between the plurality of line terminals and the plurality of load terminals in a reset state and decoupled in a tripped state;

a sensor assembly including a differential transformer and a grounded neutral transformer, the internal line conductor and the internal neutral conductor being routed through the differential transformer and the grounded neutral transformer;

an automatic test circuit including a test conductor routed through the differential transformer and the grounded neutral transformer, the automatic test circuit being configured to commence an automatic test at a predetermined time such that a test current propagates on the test conductor, the sensor assembly providing a sensor test output responsive to the test current only if both the differential transformer and the grounded neutral transformer are operative;

a protective circuit including a fault detector circuit and a power supply circuit coupled to the plurality of line terminals, the power supply circuit being charged in the reset state and charged in the tripped state and in the properly wired condition, the fault detector circuit being configured to generate a test detection signal in response to the sensor test output only if the fault detector circuit is operable and the at least one power supply is substantially charged; and a device integrity evaluation circuit coupled to the plurality of load terminals, the device integrity evaluation circuit including a timing circuit configured to provide a time measurement and a tripping stimulus to effect the tripped state when the time measurement exceeds a predetermined threshold, the test detection signal resetting the time measurement in the properly wired condition before the time measurement exceeds the predetermined threshold but does not reset the time measurement in the miswired condition.

2. The device of claim 1, wherein the test conductor is not connected to the internal line conductor or the internal neutral conductor.

3. The device of claim 1, further comprising a circuit interrupter assembly including a plurality of moveable contacts, the plurality of movable contacts being configured to be latched into the reset state in response to a reset stimulus and driven into the tripped state in response to the tripping stimulus.

4. The device of claim 3, wherein the power supply circuit is coupled to the plurality of line terminals by way of a switch disposed in parallel with an impedance component, the switch being operatively coupled to a circuit interrupter assembly to open or close in response to the tripped state or the reset state.

5. The device of claim 3, further comprising at least one circuit configured to be open circuited after AC power is initially applied to the line terminals, the at least one switch element opening and closing independently of the circuit interrupter assembly.

6. The device of claim 1, wherein the at least one power supply is coupled to the plurality of load terminals via an isolation component.

7. The device of claim 1, wherein the automatic test circuit is configured to process a signal derived from the source of AC power in order to establish the predetermined time.

8. The device of claim 7, wherein the predetermined time is based on a time constant.

9. The device of claim 7, wherein the automatic test circuit includes a resistor and a device characterized by a predetermined reactance.

10. The device of claim 1, wherein the automatic test circuit is configured to schedule the time measurement during a predetermined portion of the AC line cycle.

11. The device of claim 1, wherein the automatic test circuit is configured to propagate the test current on the test conductor during portions of a positive half cycle of the AC line cycle and portions of a negative half cycle of the AC line cycle.

12. The device of claim 1, wherein the power supply circuit is coupled to an indicator circuit when the device is in the tripped state.

13. The device of claim 1, wherein the power supply circuit is configured to substantially suppress the sensor test fault output at a predetermined time in order to prevent the test detection signal from causing a transition from the reset state to the tripped state.

14. The device of claim 1, further comprising at least one indicator, the at least one indicator including a visual indicator configured to provide a periodic visual signal when the time measurement exceeds the predetermined threshold.

15. The device of claim 1, wherein the power supply circuit is coupled to the plurality of line terminals by way of a switch disposed in parallel with an impedance component.

16. The device of claim 1, further comprising a wiring state detection circuit coupled between the line terminals and configured to provide a predetermined signal if the proper wiring condition has been effected.

17. The device of claim 16, wherein the predetermined signal includes a current flow simulating a fault condition.

18. The device of claim 1, wherein the wiring state detection circuit assembly comprises: a first circuit coupled between the plurality of line terminals and configured to provide a predetermined response in the properly wired condition, the circuit being substantially disabled after the occurrence of the predetermined response; and a second circuit coupled between the plurality of load terminals, the second circuit being configured to provide power to the device integrity evaluation circuit from the plurality of load terminals when the device is in the miswired condition and in the tripped state.

19. The device of claim 1, further comprising at least one circuit configured to be open circuited after AC power is initially applied to the line terminals.

20. The device of claim 19, wherein the at least one circuit includes at least one switch element, the predetermined current flow being conducted if the at least one switch element is closed.

21. The device of claim 20, wherein the at least one switch element includes at least one contact coupled to a printed circuit board.

22. The device of claim 1, wherein the device integrity evaluation circuit is coupled to the plurality of load terminals by way of at least one power isolation component.

23. The device of claim 22, wherein the at least one power isolation component includes an auxiliary switching element, the auxiliary switching element being configured to decouple the device integrity evaluation circuit from one of the plurality of line terminals when the circuit interrupter assembly is in the tripped state.

24. The device of claim 22, wherein the at least one power isolation component is selected from a family of components that includes air gap structures, impedance devices, semi-conducting devices, or optical coupled devices.

25. The device of claim 1, wherein the device integrity evaluation circuit further comprises: an accumulation circuit configured to derive power from the plurality of line terminals in the properly wired condition or from the plurality of load terminals in the miswired condition, the accumulation circuit being configured to accumulate charge, the time measurement being a function of accumulated charge, the accumulated charge being substantially reduced to zero in response to the test detection signal; and an actuator assembly coupled to a circuit interrupter assembly, the actuator assembly being configured to provide the tripping stimulus when the accumulated charge exceeds a predetermined threshold.

26. The device of claim 1, wherein test detection signal is configured to reset the time measurement provided by the timing circuit.

* * * * *